US012813263B2

(12) United States Patent
Kang et al.

(10) Patent No.: US 12,813,263 B2
(45) Date of Patent: Nov. 24, 2026

(54) SEMICONDUCTOR PACKAGE HAVING A HEAT SPREADER OR HEAT SLUG DEFINING A CAVITY ON A SEMICONDUCTOR DIE AND WITH THROUGH HOLES IN A BASE PORTION OR SUPPORTING PART THEREOF

(71) Applicant: Samsung Electronics Co., Ltd., Suwon-si (KR)

(72) Inventors: Sunggu Kang, Suwon-si (KR); Jae Choon Kim, Suwon-si (KR); Sung-Ho Mun, Suwon-si (KR); Hwanjoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/380,854

(22) Filed: Oct. 17, 2023

(65) Prior Publication Data

US 2024/0321669 A1 Sep. 26, 2024

(30) Foreign Application Priority Data

Mar. 20, 2023 (KR) ........................ 10-2023-0035750

(51) Int. Cl.
*H10W 40/22* (2026.01)
*H10B 80/00* (2023.01)
(Continued)

(52) U.S. Cl.
CPC ............ *H10W 40/22* (2026.01); *H10B 80/00* (2023.02); *H10W 70/635* (2026.01);
(Continued)

(58) Field of Classification Search
CPC . H10W 40/03–037; H10W 40/20–242; H10W 90/726; H10W 90/736;
(Continued)

(56) References Cited

U.S. PATENT DOCUMENTS 9,076,754 B2 7/2015 Hung et al.
9,318,411 B2 4/2016 Lin et al.
(Continued)

FOREIGN PATENT DOCUMENTS

JP 2009-81261 A 4/2009
KR 1020130081993 A 7/2013
KR 102308384 B1 10/2021

*Primary Examiner* — Younes Boulghassoul
(74) *Attorney, Agent, or Firm* — Muir Patent Law, PLLC

(57) ABSTRACT

A semiconductor package includes a substrate, a semiconductor die on the substrate, a heat spreader covering the semiconductor die. The heat spreader includes an upper plate portion, a base portion, and a sidewall portion connecting the upper plate portion to the base portion. The upper plate portion and the sidewall portion define an underlying cavity. The base portion is disposed on the substrate, extends from an exterior side of the sidewall portion in a horizontal direction, includes a plurality of first through holes, has a bottom surface at the same level as a bottom surface of the sidewall portion, and has a height in a vertical direction from a lowermost portion to an uppermost portion thereof less than or equal to that of the sidewall portion.

20 Claims, 21 Drawing Sheets

(51) Int. Cl.

| | |
|---|---|
| ***H10W 70/63*** | (2026.01) |
| ***H10W 70/685*** | (2026.01) |
| ***H10W 74/10*** | (2026.01) |
| ***H10W 90/00*** | (2026.01) |
| ***H10W 90/20*** | (2026.01) |

(52) U.S. Cl.

CPC ........ *H10W 70/685* (2026.01); *H10W 74/117* (2026.01); *H10W 90/00* (2026.01); *H10W 90/288* (2026.01); *H10W 90/701* (2026.01); *H10W 90/722* (2026.01); *H10W 90/724* (2026.01); *H10W 90/736* (2026.01)

(58) Field of Classification Search

CPC ............. H10W 90/737; H10W 90/756; H10W 90/757; H10W 90/766; H10W 90/767; H10W 90/796; H10W 90/288; H10W 70/635; H10W 70/095; H10W 20/20–233; H10W 20/023–0265; H10W 70/611; H01L 23/49827; H01L 23/5384; H01L 23/481; H01L 29/4175; H01L 21/76898; H01L 21/486

See application file for complete search history.

(56) References Cited

U.S. PATENT DOCUMENTS

| | | | | |
|---|---|---|---|---|
| 9,355,985 | B2 * | 5/2016 | Vincent | H10W 42/00 |
| 9,673,175 | B1 * | 6/2017 | Bharatham | H10W 90/00 |
| 10,515,867 | B2 | 12/2019 | Wu et al. | |
| 10,886,192 | B2 | 1/2021 | Lim et al. | |
| 10,964,618 | B2 | 3/2021 | Lee et al. | |
| 2011/0227209 | A1 * | 9/2011 | Yoon | H10W 74/117 438/109 |
| 2015/0084170 | A1 * | 3/2015 | Im | H10W 40/228 438/107 |
| 2015/0115467 | A1 * | 4/2015 | Park | H10W 20/42 174/251 |
| 2015/0130046 | A1 * | 5/2015 | Lin | H10W 40/10 438/122 |
| 2015/0279759 | A1 * | 10/2015 | Miyakoshi | H10W 40/10 257/738 |
| 2017/0287856 | A1 * | 10/2017 | Lee | H10W 76/40 |
| 2019/0273030 | A1 * | 9/2019 | Lim | H10W 40/22 |
| 2019/0287951 | A1 * | 9/2019 | Kim | H10W 70/09 |
| 2020/0312736 | A1 * | 10/2020 | Singh | H10W 40/22 |
| 2021/0159147 | A1 * | 5/2021 | Lin | H10W 40/228 |
| 2021/0193547 | A1 | 6/2021 | Wan et al. | |
| 2021/0193552 | A1 | 6/2021 | Wan et al. | |
| 2023/0038413 | A1 * | 2/2023 | Kang | H10W 40/00 |
| 2023/0101149 | A1 * | 3/2023 | Yoo | H10W 40/22 257/773 |
| 2023/0124783 | A1 * | 4/2023 | Kim | H10W 40/47 257/712 |
| 2023/0170339 | A1 * | 6/2023 | Yi | H10W 40/228 |
| 2023/0207414 | A1 * | 6/2023 | Cho | H10P 72/74 257/668 |
| 2023/0395459 | A1 * | 12/2023 | Kang | H10W 40/22 |

* cited by examiner

SEMICONDUCTOR PACKAGE HAVING A HEAT SPREADER OR HEAT SLUG DEFINING A CAVITY ON A SEMICONDUCTOR DIE AND WITH THROUGH HOLES IN A BASE PORTION OR SUPPORTING PART THEREOF

CROSS-REFERENCE TO RELATED APPLICATION

This application claims priority to and the benefit of Korean Patent Application No. 10-2023-0035750 filed in the Korean Intellectual Property Office on Mar. 20, 2023, the entire contents of which are incorporated herein by reference.

BACKGROUND OF THE INVENTION

(a) Field of the Invention

The present invention relates to a semiconductor package.

(b) Description of the Related Art

In the semiconductor industry field, there is a trend of lightening, thinning, down-sizing, and producing higher speed and multifunctional semiconductor packages that protect semiconductor chips on which integrated circuits are formed. When the semiconductor package is lightweight, thin, down-sized, higher speed, and multifunctional, more power is consumed per unit volume of the semiconductor package, which causes the temperature inside the semiconductor package to increase. If the heat generated in the semiconductor package cannot be efficiently discharged in response to the temperature increase of the semiconductor package, a warpage may occur in the package due to a difference in a thermal stress on the package structure, and an operation speed of the semiconductor package may be slow, thereby product reliability may be deteriorated.

To address this issue, a heat slug, also referred to as a heat spreader, may be used in a semiconductor package. The heat slug is composed of a metal material with high thermal conductivity, and serves to improve thermal characteristics of the semiconductor package by dissipating heat generated in the semiconductor package.

Particularly, a package on package (POP) device has a structural characteristic in which a front redistribution layer (FRDL) structure is disposed on the bottom of the molded semiconductor die, and a back side redistribution layer (BRDL) structure and an upper semiconductor package is disposed on the top of the molded semiconductor die, so it is difficult to efficiently dissipate the heat generated by the semiconductor die and each wire. Accordingly, in order to improve the thermal characteristics of the package-on-package (PoP) device, a heat slug may be applied to the package-on-package (PoP) device.

However, if a heat slug is applied to a package on package (PoP) device, the heat slug should be disposed by avoiding the conductive posts that connect the upper semiconductor package and the lower semiconductor package, and if the heat slug is disposed by avoiding the conductive posts, there is a problem that the size of the package on package (PoP) device increases by as much as the size of the heat slug.

Therefore, it is desirable to develop a new package technology that can apply the heat slug to the package-on-package (PoP) device while maintaining the size of the package-on-package (PoP) device.

SUMMARY OF THE INVENTION

In some embodiments, to maintain the size of the semiconductor package when applying a heat slug to the semiconductor package, a semiconductor package includes an upper plate part, a sidewall part, and a supporting part having a plurality of through holes, and includes a heat slug in which conductive posts or passive elements are disposed in through holes.

According to some embodiments, a semiconductor package comprising a substrate, a semiconductor die on the substrate, a heat spreader covering the semiconductor die. The heat spreader includes an upper plate portion, a base portion, and a sidewall portion connecting the upper plate portion to the base portion. The upper plate portion and the sidewall portion define an underlying cavity. The base portion is disposed on the substrate, extends from an exterior side of the sidewall portion in a horizontal direction, includes a plurality of first through holes, has a bottom surface at the same level as a bottom surface of the sidewall portion, and has a height in a vertical direction from a lowermost portion to an uppermost portion thereof less than or equal to that of the sidewall portion.

According to some embodiments, a semiconductor package includes a first redistribution layer structure that forms a package substrate, a first semiconductor die on the first redistribution layer structure, a heat spreader including an upper plate part, a sidewall part, and a supporting part, a plurality of posts on the first redistribution layer structure, and a molding material. The upper plate part and the sidewall part define an underlying cavity, the upper plate part covers at least part of a first semiconductor die, and the supporting part is disposed on the first redistribution layer structure, extends from an exterior side of the sidewall part in a horizontal direction, includes a plurality of first through holes, has a bottom surface at the same level as the bottom surface of the sidewall part, and has a height of less than or equal to that of the sidewall part. Furthermore, each conductive post among the plurality of conductive posts passes through a respective first through hole among the plurality of first through holes. The molding material encapsulates the first semiconductor die, the heat spreader, and the plurality of conductive posts, and is disposed on the first redistribution layer structure. A second redistribution layer structure is disposed on the molding material and the plurality of conductive posts, and a second semiconductor die is disposed on the second redistribution layer structure.

According to some embodiments, a semiconductor package includes a front side redistribution layer structure, a three-dimensional integrated circuit (3D IC) structure including a first semiconductor die on the front side redistribution layer structure, and a second semiconductor die on the first semiconductor die a heat slug including an upper plate portion, a sidewall portion, and a base portion. The upper plate portion and the sidewall portion define an underlying cavity, the upper plate portion is disposed on the first semiconductor die and includes a through opening in which the second semiconductor die is disposed, and the base portion is disposed on the front side redistribution layer structure, extends from an exterior side of the sidewall portion in a horizontal direction, and includes a plurality of first through holes. The semiconductor package further includes a plurality of conductive posts on the front side redistribution layer structure, wherein each conductive post among the plurality of conductive posts passes through a respective first through hole among the plurality of first through holes; a molding material molding the three-dimensional integrated circuit structure, the heat slug, and the plurality of conductive posts, and disposed on the front side redistribution layer structure; a back side redistribution layer structure on the molding material and the plurality of conductive posts; and a third semiconductor die on the back side redistribution layer structure.

According to an embodiment, in the semiconductor package including the heat slug, the heat slug may include the upper plate part, the sidewall part, and the supporting part having the through holes, and the conductive post may be disposed within the through hole of the supporting part of the heat slug or the passive element may be disposed within the through opening. Accordingly, the size of the semiconductor package may be maintained when the heat slug is applied to the semiconductor package.

According to an embodiment, in the semiconductor package including the heat slug, in line with the structure of the semiconductor die in the lower semiconductor package of the package-on-package (PoP) device and the arrangement of the conductive posts, thermal characteristics of the semiconductor package may be improved by disposing the heat slug of the various shapes into the lower semiconductor package of the package-on-package (PoP) device.

According to an embodiment, in the semiconductor package, the heat slug includes the upper plate part, the sidewall part, and the supporting part, the through holes in which the molding material is movable are formed in the upper plate part or the sidewall part of the heat slug, and the molding material moves inside the heat slug through the through holes, thereby protecting the semiconductor die.

BRIEF DESCRIPTION OF THE DRAWINGS

FIG. 1 is a cross-sectional view taken along a line C-C' of a plan view of FIG. 3 and FIG. 4.

FIG. 2 is a cross-sectional view of a plan view of FIG. 3 and FIG. 4 cut along line D-D'.

FIG. 2 is cut along a line A-A'.

FIG. 2 is taken along a line B-B'.

FIG. 6 is a cross-sectional view of a plan view of FIG. 7 and FIG. 8 taken along a line C-C'.

FIG. 13 to FIG. 21 show a method of manufacturing a semiconductor package of FIG. 1.

FIG. 14 is a cross-sectional view showing mounting a first semiconductor die on the front side redistribution layer structure as one among steps of a method of manufacturing a semiconductor package.

FIG. 15 is a cross-sectional view showing mounting a second semiconductor die on a first semiconductor die as one among step of a method of manufacturing a semiconductor package.

FIG. 16 is a cross-sectional view showing attaching a heat slug on a front side redistribution layer structure and a first semiconductor die as one among step of a method of manufacturing a semiconductor package.

FIG. 17 is a cross-sectional view showing forming conductive posts in first through holes of a heat slug as one among step of a method of manufacturing a semiconductor package.

FIG. 18 is a cross-sectional view showing molding a first semiconductor die, a second semiconductor die, a heat slug, and conductive posts on a front side redistribution layer structure as one among steps of a method of manufacturing a semiconductor package.

FIG. 19 is a cross-sectional view showing forming a back side redistribution layer structure on a molding material as one among steps of a method of manufacturing a semiconductor package.

FIG. 20 is a cross-sectional view showing mounting a third semiconductor die on a back side redistribution layer structure as one among step of a method of manufacturing a semiconductor package.

FIG. 21 is a cross-sectional view showing removing a carrier from a front side redistribution layer structure as one among steps of a method of manufacturing a semiconductor package.

DETAILED DESCRIPTION OF THE EMBODIMENTS

Figure 1:
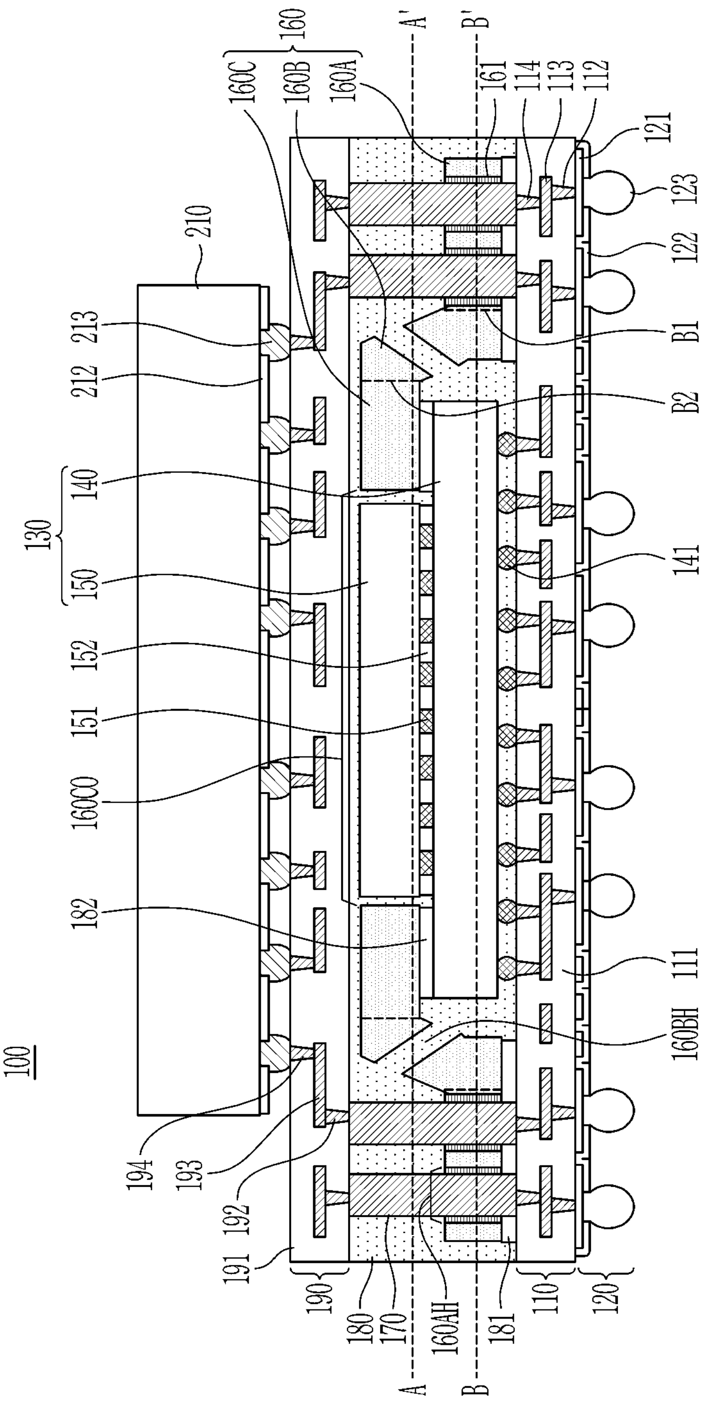
FIG. 1 is a cross-sectional view showing a semiconductor package including a heat slug including a supporting part having first through holes, a sidewall part having second through holes and extending to be inclined, and an upper plate part having a through opening.

In the following detailed description, only certain embodiments of the present invention have been shown and described, simply by way of illustration. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses.

Throughout the specification, when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. In addition, unless explicitly described to the contrary, the word "comprise", and variations such as "comprises" or "comprising", will be understood to imply the inclusion of stated elements but not the exclusion of any other elements.

In the specification, the word "on" means positioned above or below the object portion, and does not necessarily mean positioned on the upper side of the object portion based on a gravitational direction. Further, spatially relative terms, such as "beneath," "below," "lower," "above," "upper," "top," "bottom," "front," "rear," and the like, may be used herein for ease of description to describe positional relationships, such as illustrated in the figures, for example. It will be understood that the spatially relative terms encompass different orientations of the device in addition to the orientation depicted in the figures.

Further, in the specification, the phrase "on a plane" means when an object portion is viewed from above, and the phrase "on a cross-section" means when a cross-section taken by vertically cutting an object portion is viewed from the side.

Hereinafter, a semiconductor package and a semiconductor package manufacturing method of an embodiment will be described with reference to accompanying drawings.

FIG. 1 is a cross-sectional view showing a semiconductor package 100 including a heat slug 160 (i.e., heat spreader) having a supporting part 160A having first through holes 160AH, a sidewall part 160B having a second through holes 160BH and extending to be inclined, and an upper plate part 160C having a through opening 160CO. FIG. 1 is a cross-sectional view of a plan view of FIG. 3 and FIG. 4 cut along line C-C'. The supporting part discussed herein throughout may be additionally referred to as a base plate, or base plate portion, or an outer portion. The sidewall part discussed herein throughout may be additionally referred to as a connecting portion, or a connecting wall, or an intermediate connecting portion. The upper plate part discussed herein throughout may be additionally referred to as a top plate or top plate portion, or an inner portion. Outer, intermediate, and inner refer to an orientation from a plan view.

Referring to FIG. 1, a semiconductor package 100 may include a front side redistribution layer structure 110, an external connection structure 120, a three dimensional Integrated circuit (3D IC) structure 130 including a first semiconductor die 140 and a second semiconductor die 150, a heat slug 160, conductive posts 170, a molding material 180, a back side redistribution layer structure 190, and a third semiconductor die 210. As also described in other portions herein, a semiconductor die described here may be a semiconductor chip formed from a wafer and including an integrated circuit thereon. For example, certain chips may be memory chips, logic chips, controller chips, or processor chips.

In an embodiment, the semiconductor package 100 may be a package on package (PoP) device. In an embodiment, the semiconductor package 100 may include a fan out wafer level Package (FOWLP) or a fan out panel level package (FOPLP).

The front side redistribution layer structure 110 may include a first dielectric layer 111, first redistribution vias 112, first redistribution lines 113, and second redistribution vias 114 in the first dielectric layer 111. In another embodiment, a redistribution layer structure including fewer or greater numbers of redistribution lines and redistribution vias is included in the scope of the present disclosure.

The first dielectric layer 111 protects and insulates the first redistribution vias 112, the first redistribution lines 113, and the second redistribution vias 114. The three dimensional integrated circuit (3D IC) structure 130 including a first semiconductor die 140 and a second semiconductor die 150, a heat slug 160, and a conductive posts 170 may be disposed on the upper surface of the first dielectric layer 111. the external connection structure 120 may be disposed on the bottom surface of the first dielectric layer 111.

The first redistribution via 112 may be disposed between the first redistribution line 113 and the conductive pad 121 of the external connection structure 120. Various components shown in the plural will be described herein in either the plural or the singular. The first redistribution via 112 may electrically connect the first redistribution line 113 and the conductive pad 121 in a vertical direction. The first redistribution line 113 may be disposed between the first redistribution via 112 and the second redistribution via 114. The first redistribution line 113 may electrically connect the first redistribution via 112 and the second redistribution via 114 in a horizontal direction. Some of the second redistribution vias 114 may be disposed between the first redistribution line 113 and the conductive post 170. The second redistribution via 114 may electrically connect the first redistribution line 113 and the conductive post 170 in a vertical direction. Others of the second redistribution vias 114 may be disposed between redistribution lines 113 and connection members 141, described in more detail below.

The external connection structure 120 may be disposed on the bottom surface of the front side redistribution layer structure 110. The external connection structure 120 may include conductive pads 121, an insulation layer 122, and external connection members 123, also described as external connection terminals, or package connection terminals. The conductive pad 121 may electrically connect the first redistribution via 112 of the front side redistribution layer structure 110 and the external connection member 123. The insulation layer 122 may include a plurality of openings for soldering. The insulation layer 122 prevents the external connection members 123 from being short-circuited. The external connection members 123 may electrically connect the semiconductor package 100 to an external device. The front side redistribution layer structure 110, either as described alone, or as described in combination with the external connection structure 120, may be described herein as a package substrate, or a package-on-package substrate.

The 3D integrated circuit (3D IC) structure 130 may be disposed on the upper surface of the front side redistribution layer structure 110. The 3D integrated circuit (3D IC) structure 130 may include a first semiconductor die 140 and a second semiconductor die 150. In an embodiment, the 3D integrated circuit (3D IC) structure 130 may be a System on Chip (SoC), or may be a stack of memory chips, or a stack of memory chips including a controller chip.

The first semiconductor die 140 may be disposed on the upper surface of the front side redistribution layer structure 110. In an embodiment, the first semiconductor die 140 may include a central processing unit (CPU) or a graphics processing unit (GPU). The first semiconductor die 140 includes connection members 141, (e.g., conductive connection terminals) also described as die external connection terminals, or chip connection terminals, and may be electrically connected to the second redistribution vias 114 of the front side redistribution layer structure 110 through the connection members 141. In an embodiment, the connection members 141 may be micro bumps.

In the three-dimensional integrated circuit (3D IC) structure 130 including the first semiconductor die 140 and the second semiconductor die 150 on the first semiconductor die 140, since the second semiconductor die 150 is disposed away from the front side redistribution layer structure 110 that transmits signals and power, by disposing a through silicon via (TSV; not shown) within the first semiconductor die 140 and connecting the through silicon via (TSV; not shown) to the second semiconductor die 150, a speed of receiving and responding to the signal and power of the second semiconductor die 150 may be increased.

The second semiconductor die 150 may be disposed on the upper surface of the first semiconductor die 140. In an embodiment, the second semiconductor die 150 may include a communication chip or sensor. The second semiconductor die 150 includes connection member 151*s* (e.g., conductive connection terminals) and may be electrically connected to the first semiconductor die 140 through the connection members 151. In an embodiment, the connection members 151 may be micro bumps. The insulating member 152 surrounds and insulates the connection members 151 between the first semiconductor die 140 and the second semiconductor die 150.

The heat slug 160 may be divided into a supporting part 160A (e.g., a base plate or base portion), a sidewall part 160B (e.g., a connecting portion), and an upper plate part 160C (e.g., a top plate or top plate portion). The heat slug 160 may be referred to as a heat sink, a heat spreader, a heat spreading cover, or a heat spreading hood. The heat slug 160 may be disposed within the semiconductor package 100 to release heat generated from each semiconductor die or from wires, thereby improving the thermal characteristics of the semiconductor package.

The supporting part 160A is attached on the front side redistribution layer structure 110 to support the entire heat slug 160. The bottom surface of the supporting part 160A may be adhered on the front side redistribution layer structure 110 by an adhesive member 181. In an embodiment, the adhesive member 181 may use a material with excellent heat transfer characteristics. The adhesive member 181, also described as an adhesive layer, may contact both the bottom surface of the supporting part 160A and the top surface of the front side redistribution layer structure 110.

The supporting part 160A may extend in a horizontal direction from the exterior side of the sidewall part 160B, have the bottom surface at the same level as the bottom surface of the sidewall part 160B, and have a height (e.g., vertical thickness) from the lowest part of the exterior side of the sidewall part 160B to at least a part of the exterior side of the sidewall part 160B. For example, the supporting part 160A may have a height (e.g., vertical height from a lowermost portion to an uppermost portion) of equal to or less than the height (e.g., vertical height from a lowermost portion to an uppermost portion) of the sidewall part 160B. The uppermost portion of the supporting part 160A may have a height (in a vertical direction) above a top surface of the front side redistribution layer 110, which in this embodiment is lower than a height of an uppermost surface of the sidewall part 160B above a top surface of the front side redistribution layer 110.

The supporting part 160A may include first through holes 160AH formed in a vertical direction. In each first through hole 160AH, a conductive post 170 may be disposed inside. When a conventional heat slug is applied to a conventional package-on-package (PoP) device, since the conductive posts connecting the upper semiconductor package and the lower semiconductor package must avoid being disposed to the heat slug, there is a problem that the size of the package on package (PoP) device increases by as much as the size of the heat slug. However, according to the present disclosure, if the first through holes 160AH capable of disposing the conductive post 170 are formed in the supporting part 160A of the heat slug 160, it is possible to improve the thermal characteristics of the package-on-package (PoP) device while maintaining the size of the package-on-package (PoP) device.

The insulating member 161, also described as an insulating layer or insulating film, may be conformally disposed on the inner surface of the first through hole 160AH. In an embodiment, the insulating member 161 may be or include a thermosetting resin such as an epoxy resin. In an embodiment, the insulating member 161 may be a Molded Under-Fill (MUF). In an embodiment, the insulating member 161 may be or include a silicon oxide or a silicon nitride. In another embodiment, the space between the inner surface of the first through hole 160AH of the heat slug 160 and the conductive post 170 may be filled with air without the insulating member 161. The term "air" as discussed herein, may refer to atmospheric air, or other gases that may be present during the manufacturing process. Generally, an insulating member or insulating layer as described herein refers to an electrically-insulating member or layer. Such a layer or member may still conduct heat depending on the material it includes.

By disposing the insulating member 161 between the inner surface of the first through hole 160AH of the heat slug 160 and the conductive post 170, the conductive post 170 disposed in the first through hole 160AH of the heat slug 160 is electrically and physically separated from the inner surface of the first through hole 160AH of the heat slug 160, and the conductive post 170 and the heat slug 160 are prevented from being short-circuited.

The sidewall part 160B (e.g., connecting portion) is attached on the front side redistribution layer structure 110 to support the upper plate part 160C of the heat slug 160, and extends from the supporting part 160A to the upper plate part

160C. The bottom surface of the sidewall part 160B may be adhered on the front side redistribution layer structure 110 by an adhesive member 161. The sidewall part 160B extends in a horizontal direction from the inner boundary B1 of the supporting part 160A and also extends in an inclined, diagonal direction from the inner boundary B1, has the bottom surface at the same level as the bottom surface of the supporting part 160A, and may have a height of greater than or equal to the height of the supporting part 160A. FIG. 1 shows an embodiment in which the height of the sidewall part 160B is greater than the height of the supporting part 160A.

The sidewall part 160B may have a slope inclined in an inward direction from the bottom to the top in consideration of the step in the horizontal direction between the supporting part 160A and the upper plate part 160C. The sidewall part 160B may define an underlying cavity together with the upper plate part 160C.

The sidewall part 160B may include second through holes 160BH. The inside of the second through holes 160BH may be filled with the molding material 180. The molding material 180 may be transferred into the heat slug 160 through the second through holes 160BH to surround the first semiconductor die 140.

The upper plate part 160C may be disposed on the first semiconductor die 140 and extend horizontally from the inner boundary B2 of an upper portion of the sidewall part 160B. In another embodiment, the upper plate part 160C may include a third through holes 160CH in addition to the second through holes 160BH of the sidewall part 160B or replacing the second through holes 160BH of the sidewall part 160B.

The bottom surface of the upper plate part 160C may be attached to the first semiconductor die 140 by a thermal interface material (TIM) 182. The thermal interface material (TIM) is a material inserted to improve a thermal coupling between a heat generating device (e.g., a first semiconductor die 140) and a heat dissipating device (e.g., a heat slug 160). The thermal interface material (TIM) serves to reduce thermal contact resistance by filling the air layer of the contact surface between the heat dissipating device and the heat dissipating device.

The upper plate part 160C may include a through opening 160CO. The second semiconductor die 150 may be disposed within the through opening 160CO of the upper plate part 160C. The upper plate part 160C may surround the side surface of the second semiconductor die 150. The inner surface of the upper plate part 160C may be spaced apart from the second semiconductor die 150, and a molding material 180 may be filled between the inner surface of the upper plate part 160C and the side surface of the second semiconductor die 150. The width of the through opening 160CO of the upper plate part 160C may be smaller than the width of the cavity defining the sidewall part 160B and the upper plate part 160C.

Since the upper plate part 160C of the heat slug 160 has the through opening 160CO, in the three-dimensional integrated circuit (3D IC) structure 130, the second semiconductor die 150 disposed on the top may be disposed in the through opening 160CO of the upper plate part 160C, and the heat slug 160 may be applied to the package-on-package (PoP) device without increasing the vertical size of the package-on-package (PoP) device including the three-dimensional integrated circuit (3D IC).

The heat slug 160 may include or be formed of a metal material having high thermal conductivity such as copper or aluminum. As a test result, the temperature at the lower die of the package on package (PoP) device not including the heat slug 160 was measured at 105° C., but the temperature at the lower die of the package on package (PoP) device including the heat slug 160 is measured at 91° C., which is reduced by 14° C., without a size of the package on package (PoP) device being increased. Accordingly, if the heat slug 160 is applied to the package-on-package (PoP) device, heat generated in the package-on-package (PoP) may be efficiently discharged, and the thermal characteristics of the package-on-package (PoP) may be improved.

The conductive posts 170 may be disposed on the upper surface of the front side redistribution layer structure 110. The conductive post 170 may be disposed by penetrating the first through hole 160AH of the supporting part 160A of the heat slug 160. The conductive post 170 may electrically connect the second redistribution via 114 of the front side redistribution layer structure 110 and the third redistribution via 192 of the back side redistribution layer structure 190.

The molding material 180, on the front side redistribution layer structure 110, may mold, or encapsulate, the 3D integrated circuit (3D IC) structure 130 including the first semiconductor die 140 and the second semiconductor die 150, the heat slug 160, and the conductive posts 170. The first semiconductor die 140 disposed inside the heat slug 160 may be molded by the molding material 180 moved through the second through holes 160BH of the sidewall part 160B of the heat slug 160. Thus, the molding material 180 may be disposed under the heat slug 160, above the heat slug 160, and through the heat slug 160.

The back side redistribution layer structure 190 may be disposed on the molding material 180. The back side redistribution layer structure 190 may include a second dielectric layer 191, and third redistribution vias 192, second redistribution lines 193, and a fourth redistribution vias 194 within the second dielectric layer 191. In another embodiment, the redistribution layer structure including fewer or greater numbers of redistribution lines and redistribution vias is included in the scope of the present disclosure.

The second dielectric layer 191 protects and insulates the third redistribution vias 192, the second redistribution lines 193, and the fourth redistribution vias 194. A third semiconductor die 210 may be disposed on the upper surface of the second dielectric layer 191. A molding material 180 and conductive posts 170 may be disposed on the bottom surface of the second dielectric layer 191.

The third redistribution vias 192 may be disposed between the conductive posts 170 and the second redistribution line 193. The third redistribution vias 192 may electrically connect the conductive posts 170 and the second redistribution lines 193 in a vertical direction. The second redistribution lines 193 may be disposed between the third redistribution vias 192 and the fourth redistribution vias 194. The second redistribution lines 193 may electrically connect the third redistribution vias 192 and the fourth redistribution vias 194 in a horizontal direction. The fourth redistribution vias 194 may be disposed between the second redistribution lines 193 and the connection members 213 (e.g., connection terminals) of the third semiconductor die. The fourth redistribution vias 194 may electrically connect the second redistribution lines 193 and the connection members 213 of the third semiconductor die in a vertical direction.

The third semiconductor die 210 may be disposed on the back side redistribution layer structure 190. The third semiconductor die 210 may be a single chip such as DRAM chip or may be one of multiple chips such as high bandwidth memory (HBM). The third semiconductor die 210 may include connection members 213 and an insulation layer

212. The connection members 213 may electrically connect the third semiconductor die 210 and the back side redistribution layer structure 190. In an embodiment, the connection members 213 may be or include micro bumps or solder balls. The insulation layer 212 may include a plurality of openings for the soldering. The insulation layer 212 prevents the connection members 213 from being short-circuited. In an embodiment, insulation layer 212 may be or include a solder resist.

Figure 2:
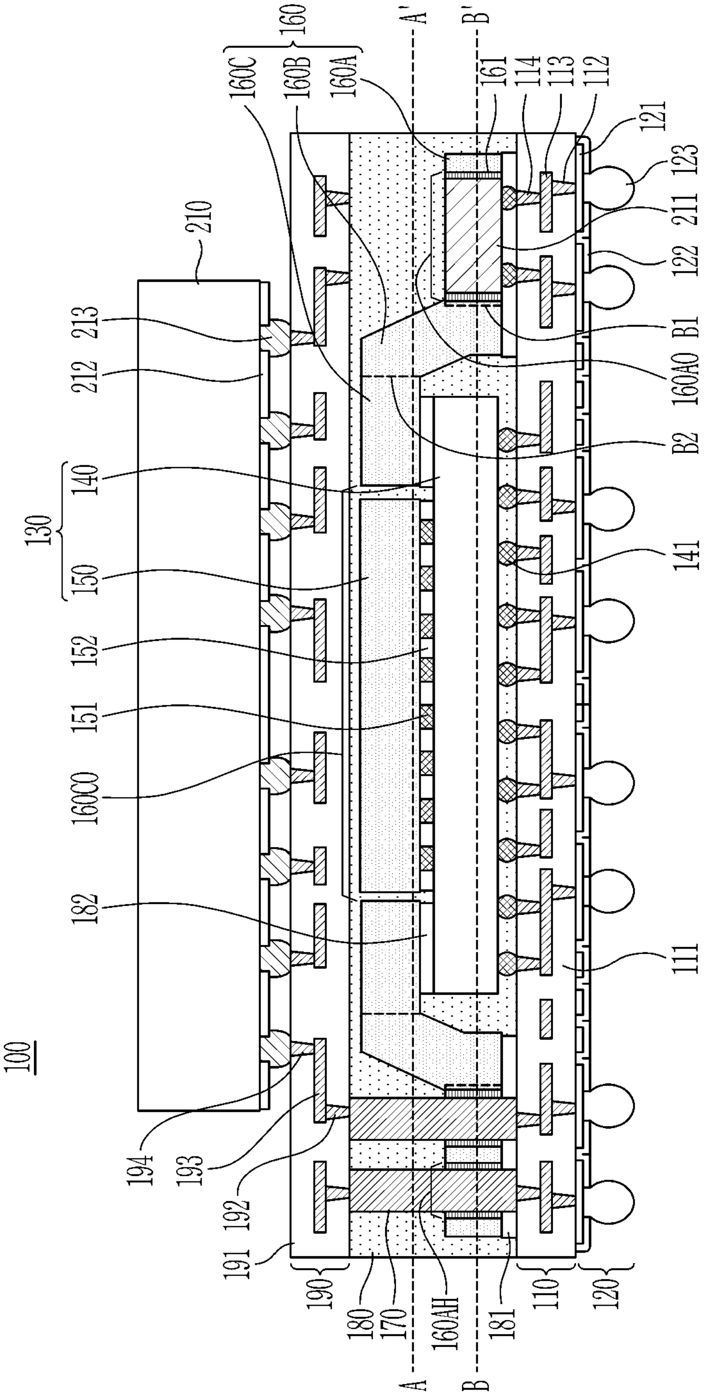
FIG. 2 is a cross-sectional view showing a semiconductor package including a heat slug including a supporting part having first through holes and a through opening, a sidewall part extending to be inclined, and an upper plate part having a through opening.

FIG. 2 is a cross-sectional view showing a semiconductor package 100 including a heat slug 160 including a supporting part 160A having first through holes 160AH and a through opening 160AO, a sidewall part 160B extending to be inclined, and an upper plate part 160C having a through opening 160CO. FIG. 2 is a cross-sectional view of a plan view of FIG. 3 and FIG. 4 cut along a line D-D'.

Referring to FIG. 2, a passive element 211 may be disposed within the through opening 160AO of the supporting part 160A of the heat slug 160 on the front side redistribution layer structure 110. The passive element 211 may be a Surface-Mount Device (SMD). In an embodiment, the passive element 211 may be a capacitor or a resistor. The insulating member 161 may be conformally disposed on the inner surface of the through opening 160AO. The insulating member 161 may surround the passive element 211. In another embodiment, the space between the inner surface of the through opening 160AO of the heat slug 160 and the passive element 211 may be filled with air without the insulating member 161.

The insulating member 161 is disposed between the inner surface of the through opening 160AO of the heat slug 160 and the passive element 211, separates the passive element 211 disposed in the through opening 160AO of the heat slug 160 from the inner surface of the through opening 160AO of the heat slug 160, and prevents the passive element 211 and the heat slug 160 from being short-circuited.

In FIG. 2, the configurations other than the passive element 211 are the same as the configurations described in FIG. 1. Accordingly, in FIG. 2, for the configurations other than the passive element 211, the contents described in FIG. 1 may be equally applied.

Figure 3:
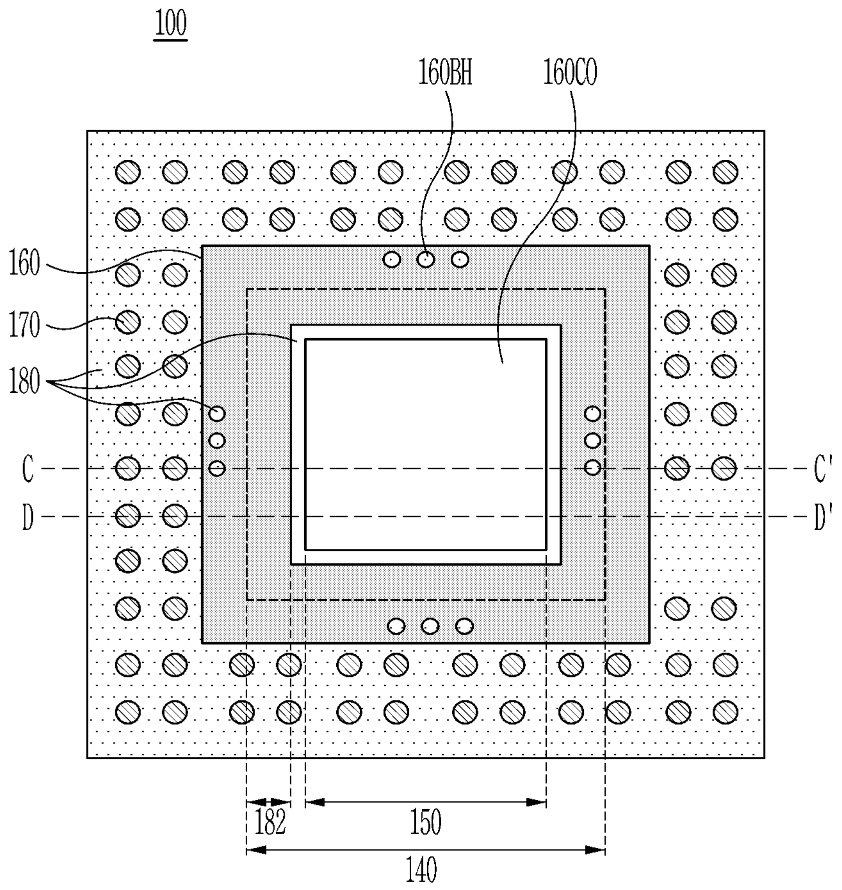
FIG. 3 is a top plan view showing a sidewall part having second through holes and an upper plate part having a through opening in a heat slug, for which a cross-section of a semiconductor package of FIG. 1

FIG. 3 is a top plan view showing a sidewall part 160B having a second through holes 160BH and an upper plate part 160C having a through opening 160CO among a heat slug 160, which a cross-section of a semiconductor package 100 of FIG. 1 and FIG. 2 is cut along a line A-A'.

Referring to FIG. 3, the second semiconductor die 150, the molding material 180, the heat slug 160, the molding material 180, and the conductive posts 170 may be disposed sequentially from the inside to the outside. The first semiconductor die 140 and the thermal interface material (TIM; 182) are disposed below the line A-A', so they are shown as dotted lines. The second through holes 160BH may be disposed at the heat slug 160 (e.g., through the heat slug). The interior of the second through holes 160BH may be filled with the molding material 180.

According to an embodiment in FIG. 3, although three second through holes 160BH having a circular shape on each surface of the heat slug 160 are shown, since the second through holes 160BH serve to transmit the molding material 180 to the inside of the heat slug 160, there is no limit in the position, size, shape, and number of holes. Therefore, the second through holes 160BH, which are disposed in various positions, have various shapes such as elliptical and polygonal shapes, fewer or larger numbers, and various sizes, are included in the scope of the present disclosure.

The conductive posts 170 are surrounded by the molding material 180 and are disposed around the heat slug 160. In an embodiment, each conductive post 170 may have the width of about 50 μm to about 300 μm. In another embodiment, a semiconductor package 100 including fewer or more conductive posts 170 is included in the scope of the present disclosure.

Figure 4:
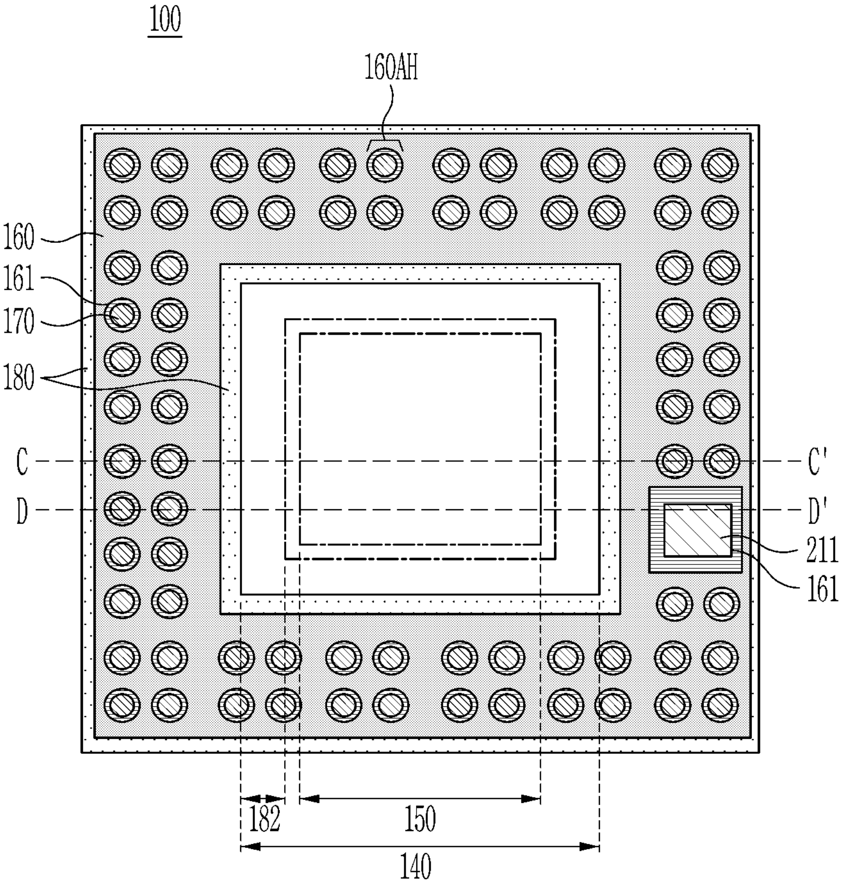
FIG. 4 is a top plan view showing a supporting part having first through holes in a heat slug, for which the semiconductor package of FIG. 1

FIG. 4 is a top plan view showing a supporting part 160A having a first through holes 160AH among a heat slug 160, that the semiconductor package 100 of FIG. 1 and FIG. 2 is taken along a line B-B'.

Referring to FIG. 4, a first semiconductor die 140, a molding material 180, a heat slug 160, an insulating member 161, conductive posts 170, a passive element 211, and a molding material 180 may be sequentially disposed from the inside to the outside, The second semiconductor die 150 and the thermal interface material (TIM) 182 are disposed above the line B-B', so they are shown as dotted lines. The first through holes 160AH may be disposed in the heat slug 160.

According to an embodiment in FIG. 4, the first through holes 160AH are shown to have a circular shape, but the shape of the first through holes 160AH is not limited. In an embodiment, the first through hole 160AH may include a cross-sectional shape of a circle, an ellipse, or a polygon in a horizontal direction. Also, according to an embodiment in FIG. 4, it is shown that one passive element 211 is disposed, but there are no restrictions on the position, shape, number, and size of the passive element 211. Therefore, the passive elements 211 that are disposed in various positions and have various shapes, and have fewer or more numbers and various sizes are included in the scope of present disclosure.

The insulating member 161 conformally disposed on the inner surface of the first through holes 160AH may have an exterior surface having the same shape as the inner surface of the first through holes 160AH, and an inner surface having the same shape as the exterior surface of the conductive post 170. The insulating member 161 conformally disposed on the inner surface of the through opening 160AO may have an exterior surface having the same shape as the shape of the inner surface of through opening 160AO and an inner surface having the same shape as the shape of the exterior surface of the passive element 211.

Figure 5:
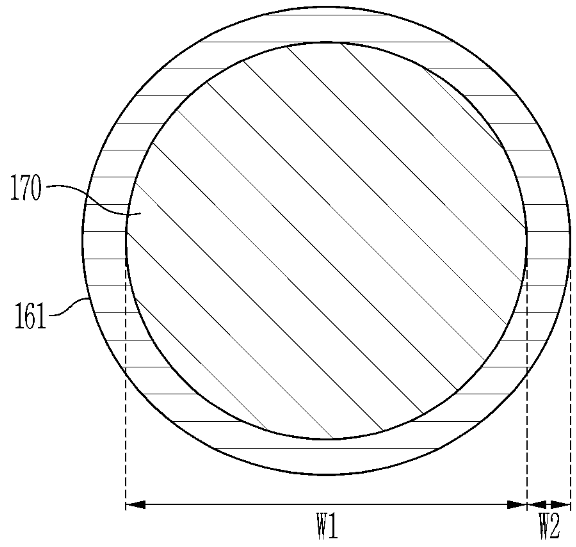
FIG. 5 is a view enlarging and showing a first through hole of a supporting part in FIG. 4.

FIG. 5 is a view enlarging and showing a first through hole 160AH of a supporting part 160A in FIG. 4.

Referring to FIG. 5, a conductive post 170 is disposed within an insulating member 161, and the insulating member 161 may be disposed within a circular first through hole 160AH. In an embodiment, the conductive post 170 may have a width W1 of about 50 μm to about 300 μm. In an embodiment, the insulating member 161 may have a thickness W2 of about 5 μm to about 15 μm. In an embodiment, the first through hole 160AH may have a width (W1+2W2) of about 55 μm to about 315 μm.

Figure 6:
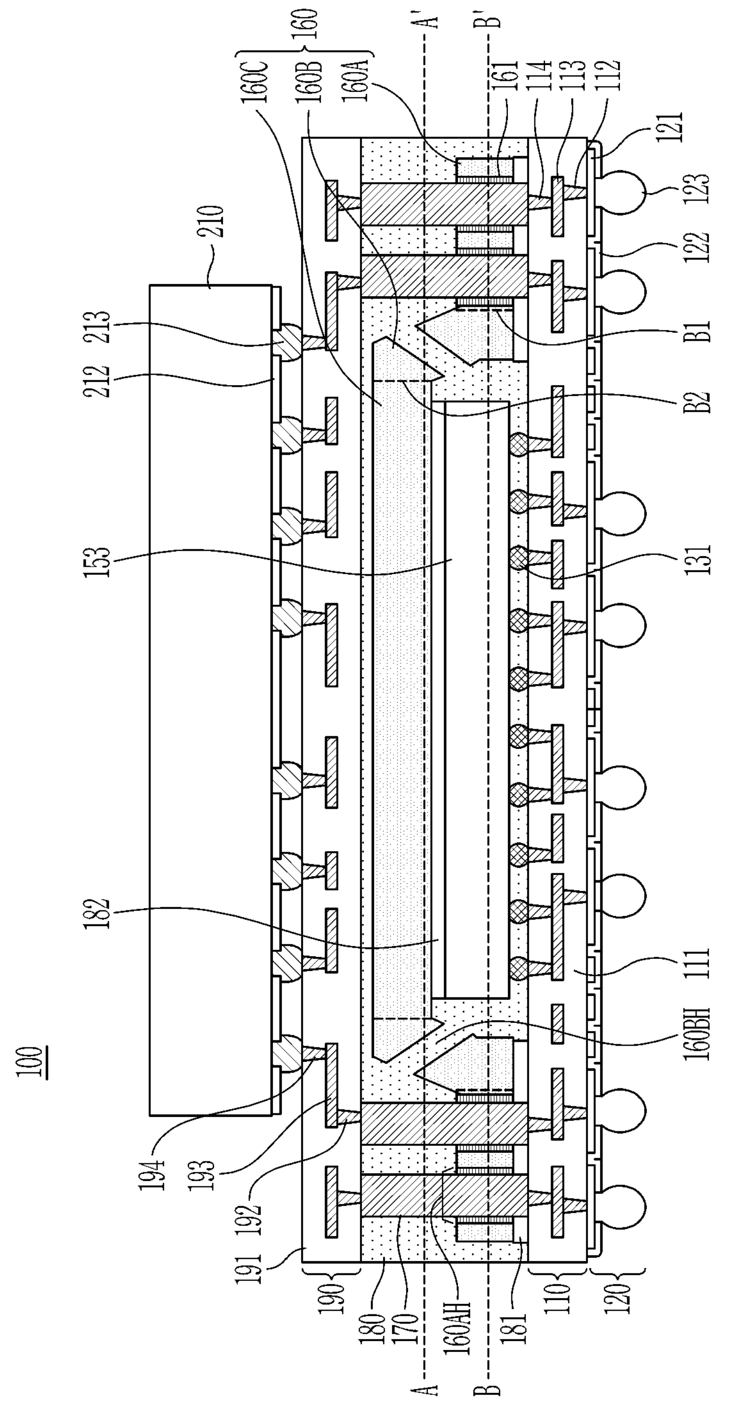
FIG. 6 is a cross-sectional view showing a semiconductor package including a heat slug including a supporting part having first through holes, a sidewall part having second through holes and extending to be inclined, and an upper plate part covering a fourth semiconductor die.

FIG. 6 is a cross-sectional view showing a semiconductor package 100 including a heat slug 160 including a supporting part 160A having first through holes 160AH, a sidewall part 160B having second through holes 160BH and extending to be inclined, and an upper plate part 160C covering a fourth semiconductor die 153. FIG. 6 is a cross-sectional view of a plan view of FIG. 7 and FIG. 8 taken along a line C-C'.

Referring to FIG. 6, an upper plate part 160C of a heat slug 160 may cover a fourth semiconductor die 153. Unlike FIG. 1, the upper plate part 160C of the heat slug 160 may not include through openings. A thermal interface material (TIM) 182 may be disposed on the entire upper surface of the fourth semiconductor die 153 and attached to the bottom surface of the heat slug 160. Since the upper plate part 160C of the heat slug 160 covers the entire upper surface of the fourth semiconductor die 153, heat generated from the fourth semiconductor die 153 may be efficiently dissipated, and the thermal characteristics of the package-on-package (PoP) device may be improved. In an embodiment, the fourth semiconductor die 153 may include a system on chip (SOC). In an embodiment, the fourth semiconductor die 153 may include at least one of a central processing unit (CPU), a graphics processing unit (GPU), a memory, a controller, a codec, a sensor, and a communication chip.

In FIG. 6, configurations other than the upper plate part 160C of the heat slug 160, the thermal interface material (TIM) 182, and the fourth semiconductor die 153 are the same as the configurations described in FIG. 1. Accordingly, in FIG. 6, for the configurations other than the upper plate part 160C of the heat slug 160, the thermal interface material (TIM) 182, and the fourth semiconductor die 153, the contents described in FIG. 1 may be equally applied. Also, although the passive element 211 is not shown in an embodiment of FIG. 6, the passive element 211 may be included in another embodiment.

Figure 7:
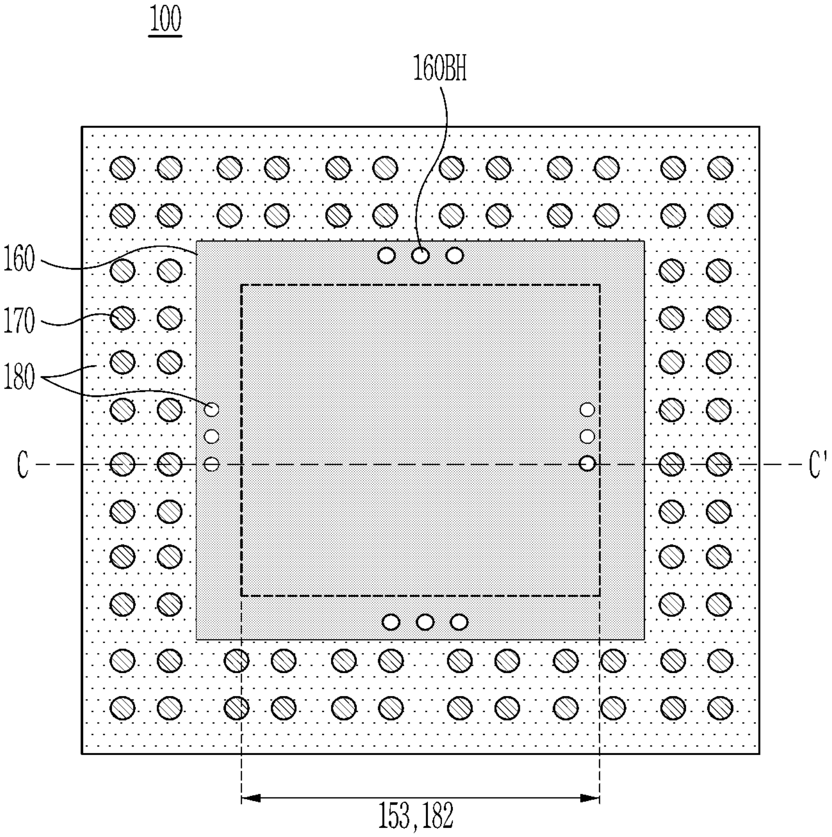
FIG. 7 is a top plan view showing a sidewall part having second through holes and an upper plate part covering a fourth semiconductor die among a heat slug, the cross-section view of the semiconductor package of FIG. 6 is taken along a line A-A'.

FIG. 7 is a top plan view showing an upper plate part 160C covering a sidewall part 160B having second through holes 160BH and a fourth semiconductor die 153, the cross-section view of the semiconductor package 100 of FIG. 6 is taken along a line A-A'.

Referring to FIG. 7, a heat slug 160, a molding material 180, and conductive posts 170 may be disposed sequentially from the inside to the outside. The fourth semiconductor die 153 is shown as a dotted line because it disposes below the line A-A'. The second through holes 160BH may be disposed at the heat slug 160. The interior of the second through holes 160BH may be filled with the molding material 180.

In FIG. 7, configurations other than the upper plate part 160C of the heat slug 160, the thermal interface material (TIM) 182, and the fourth semiconductor die 153 are the same as the configurations described in FIG. 3. Accordingly, in FIG. 7 for the configurations other than the upper plate part 160C of the heat slug 160, the thermal interface material (TIM) 182, and the fourth semiconductor die 153, the contents described in FIG. 3 may be equally applied.

Figure 8:
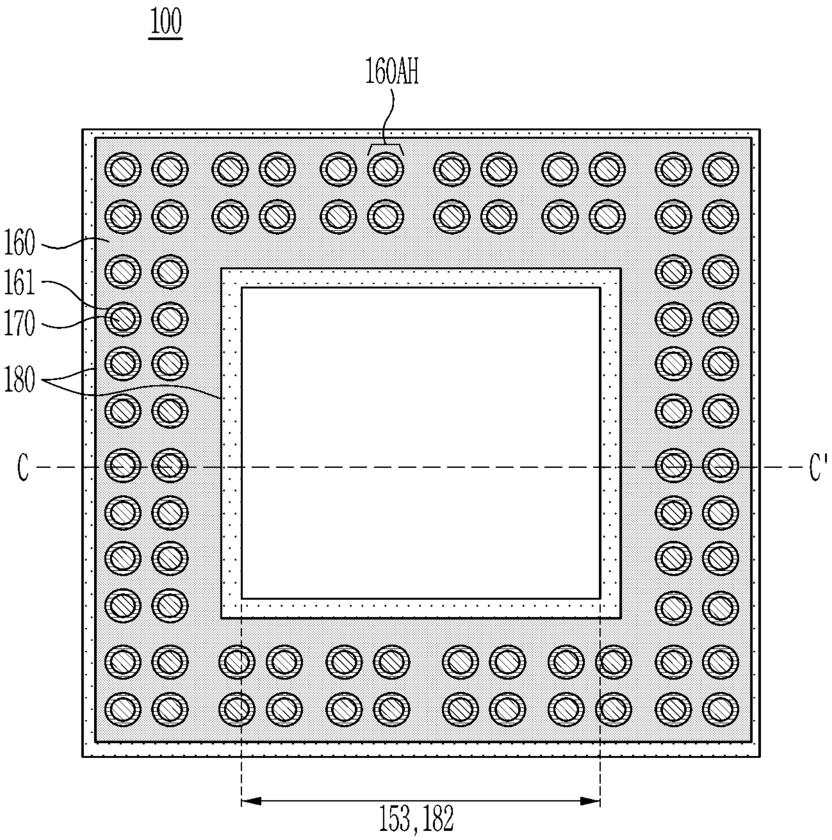
FIG. 8 is a top plan view showing a supporting part having a first through hole in a heat slug, in which the cross-sectional view of the semiconductor package of FIG. 6 is taken along a line B-B'.

FIG. 8 is a top plan view showing a supporting part 160A having a first through hole 160AH among a heat slug 160, in which the cross-sectional view of the semiconductor package 100 of FIG. 6 is taken along a line B-B'.

Referring to FIG. 8, a fourth semiconductor die 153, a molding material 180, a heat slug 160, an insulating member 161, conductive posts 170, and a molding material 180 may be disposed sequentially from the inside to the outside. The thermal interface material (TIM) 182 may have the same size as the fourth semiconductor die 153 and be disposed on the fourth semiconductor die 153 above the line B-B'. The first through holes 160AH may be disposed in the heat slug 160. In an embodiment of FIG. 8, although a passive element 211 is not shown, another embodiment may include the passive element 211.

In FIG. 8, configurations other than the fourth semiconductor die 153 are the same as the configuration described in FIG. 4. Accordingly, in FIG. 8, for the configurations other than the fourth semiconductor die 153, the contents described in FIG. 4 may be equally applied.

Figure 9:
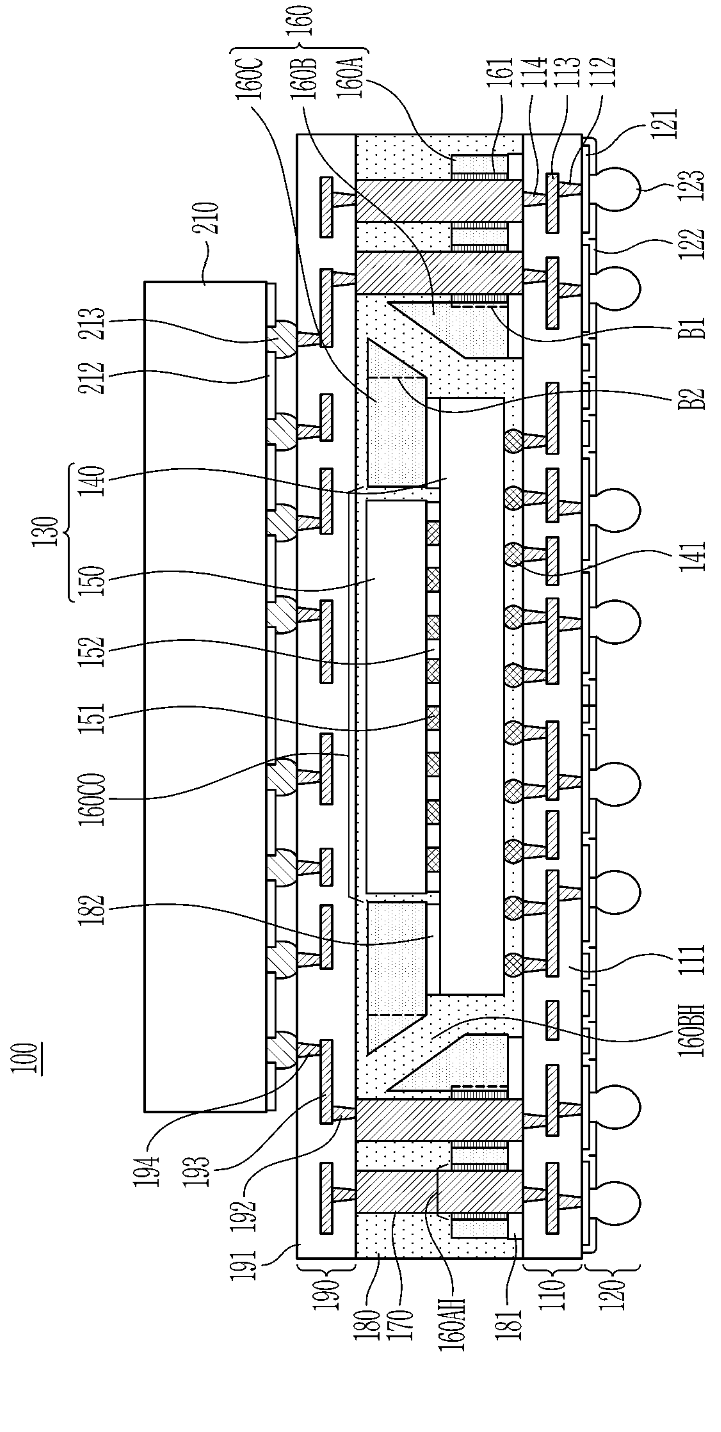
FIG. 9 is a cross-sectional view showing a semiconductor package including a heat slug including a supporting part having first through holes, a sidewall part having second through holes and vertically extending, and an upper plate part having a through opening.

FIG. 9 is a cross-sectional view showing a semiconductor package 100 including a heat slug 160 including a supporting part 160A having first through holes 160AH, a sidewall part 160B having second through holes 160BH and vertically extending, and an upper plate part 160C having a through opening 160CO.

Referring to FIG. 9, a sidewall part 160B may extend in a vertical direction in considering the step in the horizontal direction of the supporting part 160A and the upper plate part 160C. For example, in the embodiment of FIG. 1, outer surfaces of the heat slug 160, facing away from the 3D IC structure 130 may have inclined surfaces with respect to a vertical and horizontal direction, at least in the sidewall part 160B. In the embodiment of FIG. 9 (and some other embodiments), outer surfaces of the heat slug 160, facing away from the 3D IC structure 130 may not include inclined surfaces with respect to a vertical and horizontal direction, and instead, may only include vertical and horizontal surfaces.

In FIG. 9, configurations other than the sidewall part 160B extending in the vertical direction are the same as the configuration described in FIG. 1. Accordingly, in FIG. 9, for the configurations other than the sidewall part 160B extending in the vertical direction, the contents described in FIG. 1 may be equally applied.

Figure 10:
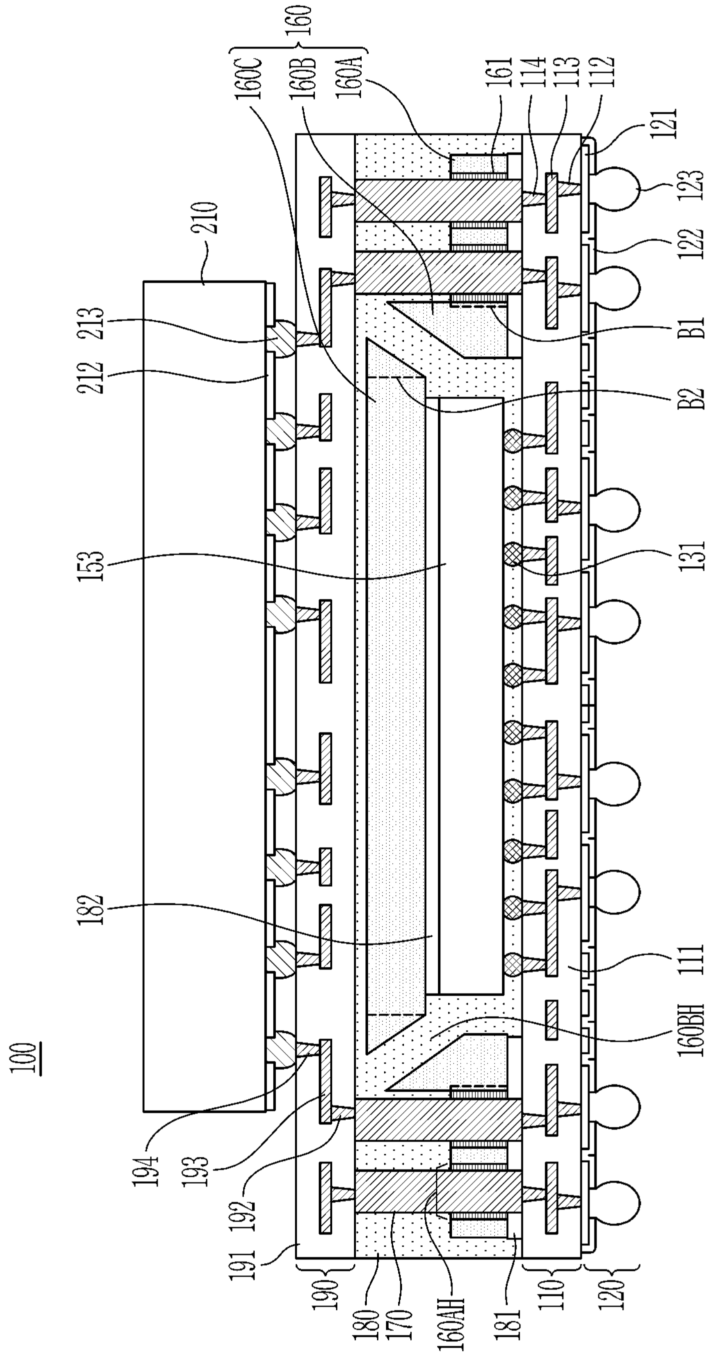
FIG. 10 is a cross-sectional view showing a semiconductor package including a heat slug including a supporting part having first through holes, a sidewall part having second through holes and extending vertically, and an upper plate part covering a fourth semiconductor die.

FIG. 10 is a cross-sectional view showing a semiconductor package 100 including a heat slug 160 including a supporting part 160A having first through holes 160AH, a sidewall part 160B having second through holes 160BH and extending vertically, and an upper plate part 160C covering a fourth semiconductor die 153.

Referring to FIG. 10, a sidewall part 160B may extend in a vertical direction in consideration of the step of the supporting part 160A and the upper plate part 160C in the horizontal direction.

In FIG. 10, configurations other than the sidewall part 160B extending in the vertical direction are the same as the configuration described in FIG. 6. Accordingly, in FIG. 10, for the configurations other than the other than the sidewall part 160B extending 10) in the vertical direction, the contents described in FIG. 6 may be equally applied. In the examples of FIGS. 1, 6, 9, and 10, the second through holes 160BH in sidewall part 160B of the heat slug 160 may extend in a diagonal direction to pass through the sidewall part 160B.

Figure 11:
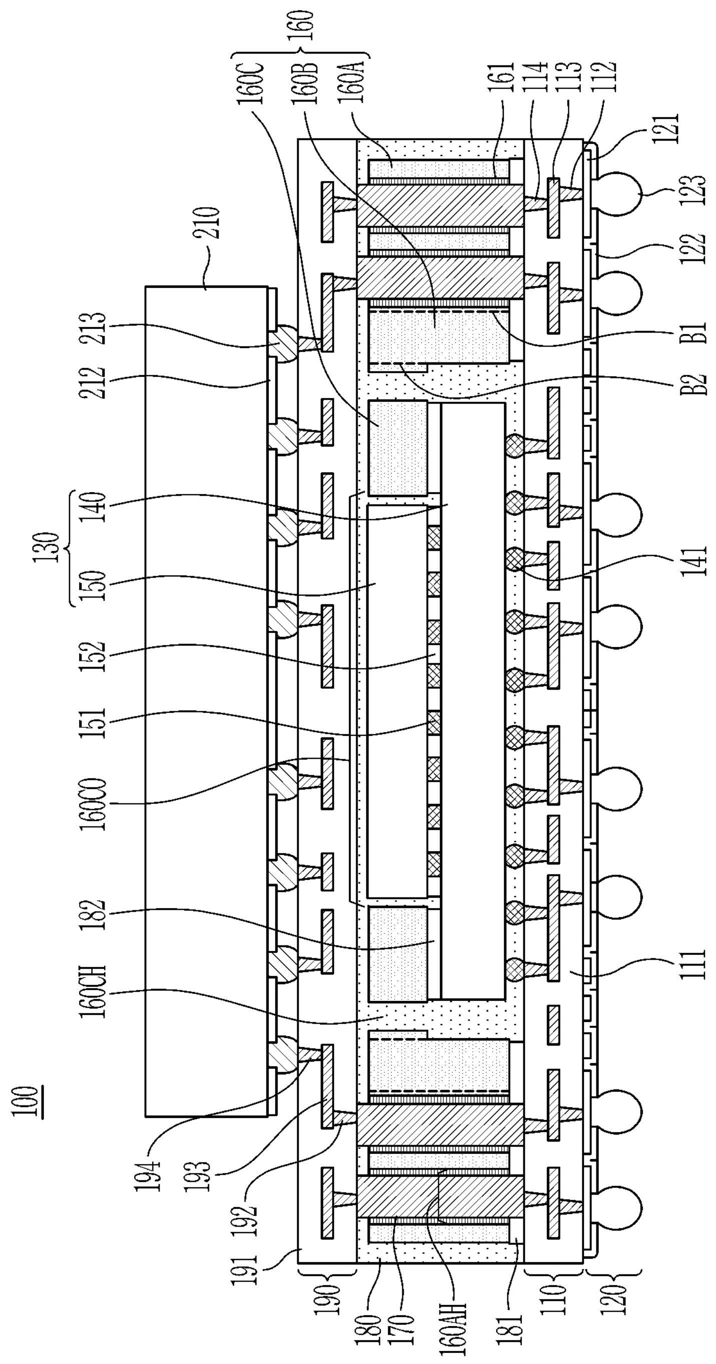
FIG. 11 is a cross-sectional view showing a semiconductor package including a heat slug including a supporting part having first through holes and extending to a height of the uppermost surface of the upper plate part, a sidewall part vertically extending to a height of the uppermost surface of the upper plate part, and an upper plate part having a third through hole and a through opening.

FIG. 11 is a cross-sectional view showing a semiconductor package 100 including a heat slug 160 including a supporting part 160A having first through holes 160AH and extending to a height of the uppermost surface of the upper plate part 160C, a sidewall part 160B vertically extending to a height of the uppermost surface of the upper plate part 160C, and an upper plate part 160C having third through holes 160CH and a through opening 160CO.

Referring to FIG. 11, the supporting part 160A and the sidewall part 160B of the heat slug 160, and the insulating member 161 within the first through holes 160AH in the supporting part 160A may extend to the height of the uppermost surface of the upper plate part 160C. According to an embodiment of the present disclosure, by increasing the volume occupied by the heat slug 160 in the lower package and decreasing the volume occupied by the molding material 180, heat generated in the package-on-package (PoP) device may be discharged more efficiently, and thermal characteristics of the package-on-package (PoP) may be improved.

The upper plate part 160C may include third through holes 160CH for moving the molding material 180 into the heat slug 160. The third through holes 160CH may extend vertically. In another embodiment, the sidewall part 160B may include second through holes 160BH by replacing the third through holes 160CH of the upper plate part 160C or in addition to the third through holes 160CH of the upper plate part 160C.

In FIG. 11, configurations other than that the supporting part 160A and the sidewall part 160B of the heat slug 160, and the insulating member 161 in the first through holes 160AH in the supporting part 160A extend to the height of the uppermost surface of the upper plate part 160C are the same as the configurations described in FIG. 9. Accordingly, in FIG. 11, for the configurations other than that the supporting part 160A and the sidewall part 160B of the heat slug 160, and the insulating member 161 in the first through holes 160AH in the supporting part 160A extend to the height of the uppermost surface of the upper plate part 160C, the contents described in FIG. 9 may be equally applied.

Figure 12:
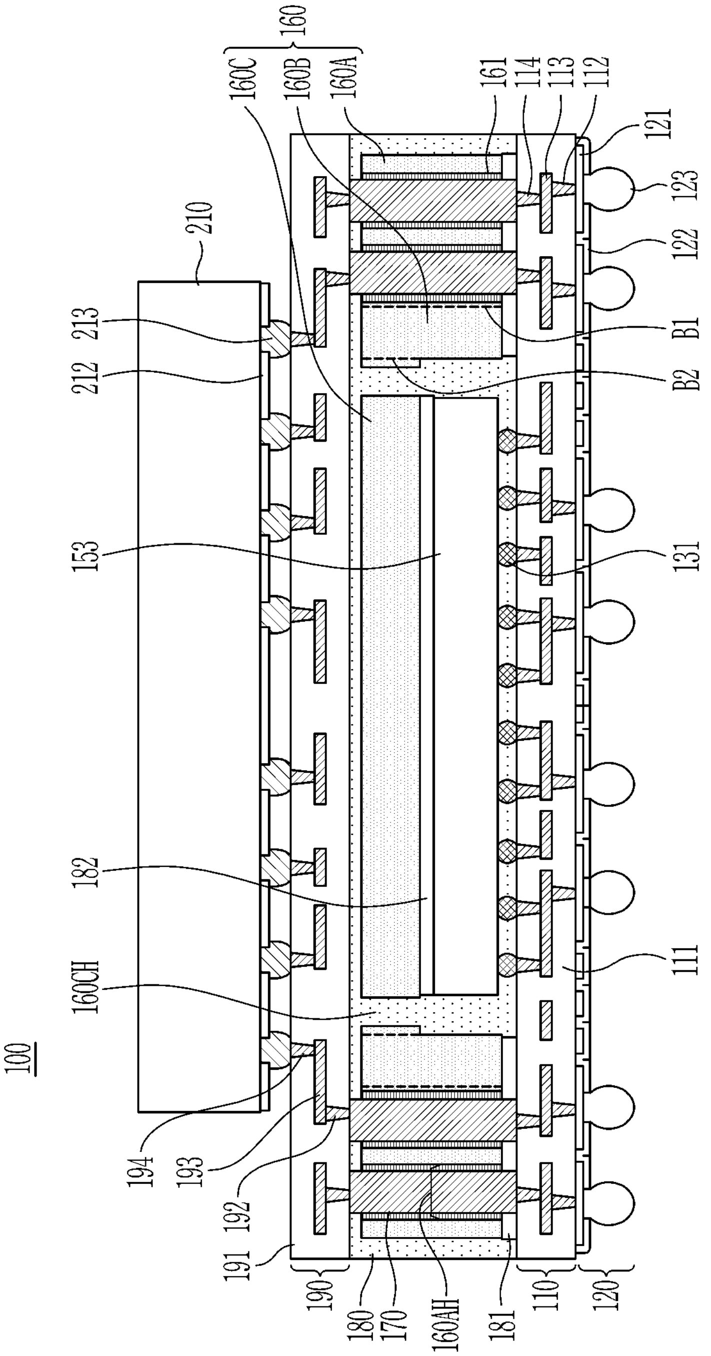
FIG. 12 is a cross-sectional view showing a semiconductor package including a heat slug including a supporting part having first through holes and extending to a height of an uppermost surface of an upper plate part, a sidewall part vertically extending to the height of the uppermost surface of the upper plate part, and an upper plate part having third through holes and covering a fourth semiconductor die.

FIG. 12 is a cross-sectional view showing a semiconductor package 100 including a heat slug 160 including a supporting part 160A having first through holes 160AH and extending to a height of an uppermost surface of an upper plate part 160C, a sidewall part 160B vertically extending to the height of the uppermost surface of the upper plate part 160C, and an upper plate part 160C having third through holes 160CH and covering a fourth semiconductor die 153.

Referring to FIG. 12, the supporting part 160A and the sidewall part 160B of the heat slug 160, and the insulating member 161 within the first through holes 160AH in the supporting part 160A may extend the height of the uppermost surface of the upper plate part 160C. According to an embodiment of the present disclosure, by increasing the volume occupied by the heat slug 160 in the lower package and decreasing the volume occupied by the molding material 180, heat generated in the package-on-package (PoP) may be discharged more efficiently, and thermal characteristics of the package-on-package (PoP) may be improved.

The upper plate part 160C may include third through holes 160CH for moving the molding material 180 into the heat slug 160. In another embodiment, the sidewall part 160B may include second through holes 160BH by replacing the third through holes 160CH of the upper plate part 160C or in addition to the third through holes 160CH of the upper plate part 160C.

In FIG. 12, configurations other than that the supporting part 160A and the sidewall part 160B of the heat slug 160, and the insulating member 161 in the first through holes 160AH in the supporting part 160A extend to the height of the uppermost surface of the upper plate part 160C are the same as the configurations described in FIG. 10. Accordingly, in FIG. 12, for the configurations other than that the supporting part 160A and the sidewall part 160B of the heat slug 160, and the insulating member 161 in the first through holes 160AH in the supporting part 160A extend to the height of the uppermost surface of the upper plate part 160C, the contents described in FIG. 10 may be equally applied.

FIG. 13 to FIG. 21 show a method of manufacturing a semiconductor package of FIG. 1. The semiconductor package of FIG. 1 and the semiconductor package of FIG. 2, FIG. 6, FIG. 9, FIG. 10, FIG. 11, and FIG. 12, is only different in the shape of the heat slug and in some cases whether two dies 140 and 150 or one die 153 are used, but since other components are the same, the method of manufacturing the semiconductor package of FIG. 13 to FIG. 21 may be also applied to the semiconductor package of FIG. 2, FIG. 6, FIG. 9, FIG. 10, FIG. 11, and FIG. 12.

Figure 13:
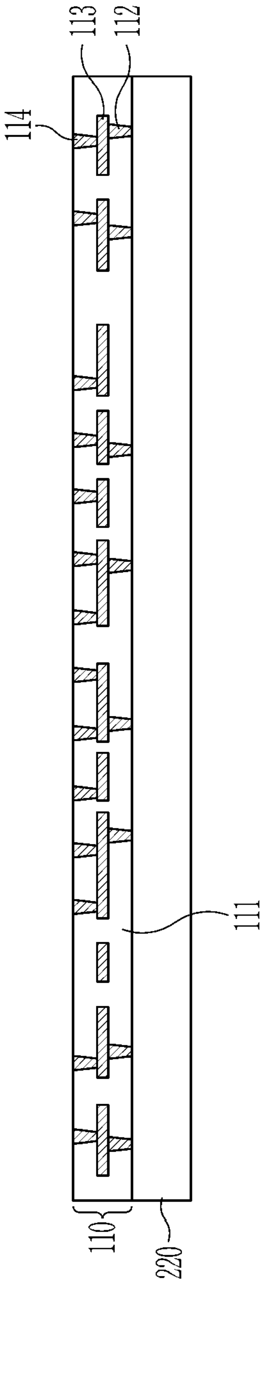
FIG. 13 is a cross-sectional view showing forming a front side redistribution layer structure on a carrier as one among steps of a method of manufacturing a semiconductor package.

FIG. 13 as one among steps of a method of manufacturing a semiconductor package 100 is a cross-sectional view showing forming a front side redistribution layer structure 110 on a carrier 220.

Referring to FIG. 13, a front side redistribution layer structure 110 is formed on a carrier 220. The carrier 220 may include or be, for example, a silicon-based material such as glass or a silicon oxide, an organic material, or another material such as aluminum oxide, any combination of these materials, and the like.

First, a first dielectric layer 111 is formed on the carrier 220. In an embodiment, the first dielectric layer 111 may include a photosensitive polymer layer. A photosensitive polymer is a material that can form fine patterns by applying a photolithography process. In an embodiment, the first dielectric layer 111 may include or be a photoimageable insulator (photoimageable dielectric, PID) used in a redistribution process. As an embodiment, the photoimageable insulator (PID) may include or be a polyimide-based photosensitive polymer, a novolak-based photosensitive polymer, polybenzoxazole, a silicon-based polymer, an acrylate-based polymer, or an epoxy-based polymer. In another embodiment, the first dielectric layer 111 is formed of an inorganic dielectric material such as a silicon nitride, a silicon oxide, or the like. In an embodiment, the first dielectric layer 111 may be formed by a CVD, ALD, or PECVD process.

After forming the first dielectric layer 111, via holes are formed by selectively etching the first dielectric layer 111, and first redistribution vias 112 are formed by filling the via holes with a conducting material.

Next, a first dielectric layer 111 is additionally deposited on the first redistribution vias 112 and the first dielectric layer 111, then the additionally deposited first dielectric layer 111 is selectively etched to form openings, and the opening is filled with a conducting material to form first redistribution lines 113.

Then, the first dielectric layer 111 is additionally deposited on the first redistribution lines 113 and the first dielectric layer 111, the additionally deposited first dielectric layer 111 is selectively etched to form via holes, and the via holes are filled with a conducting material to form second redistribution vias 114.

In an embodiment, the first redistribution vias 112, the first redistribution lines 113, and the second redistribution vias 114 may include or be at least one of copper, aluminum, tungsten, nickel, gold, tin, titanium, and alloys thereof. In an embodiment, the first redistribution vias 112, the first redistribution lines 113, and the second redistribution vias 114 may be formed by performing a sputtering process. In another embodiment, the first redistribution vias 112, the first redistribution lines 113, and the second redistribution vias 114 may be formed by performing an electroplating process after forming a seed metal layer.

Figure 14:
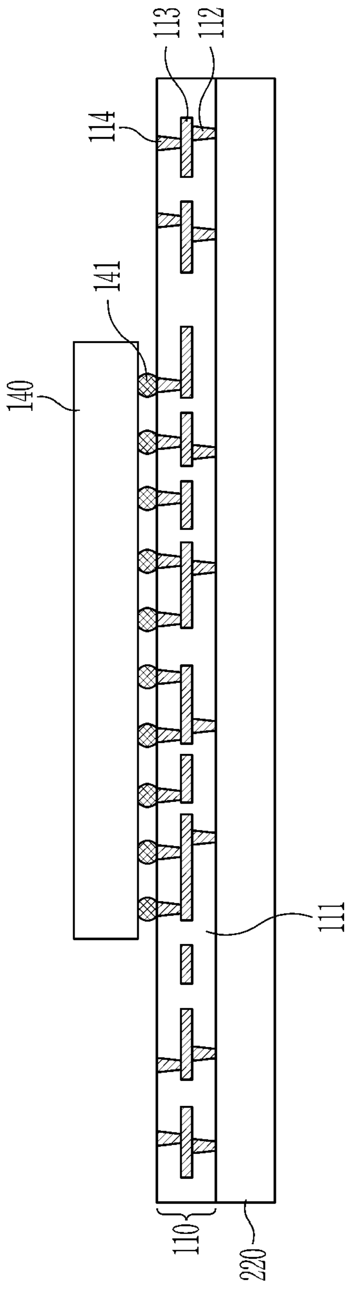

In FIG. 14, the front side redistribution layer structure 110 is a cross-sectional view showing mounting a first semiconductor die 140 on the front side redistribution layer structure 110 as one among steps of a method of manufacturing a semiconductor package 100.

Referring to FIG. 14, the first semiconductor die 140 is mounted to the front side redistribution layer structure 110. The connection members 141 of the first semiconductor die 140 are bonded to the second redistribution vias 114 of the front side redistribution layer structure 110, so that the first semiconductor die 140 and the front side redistribution layer structure 110 are electrically connected. In an embodiment, the connection members 141 may include or be micro bumps.

Figure 15:
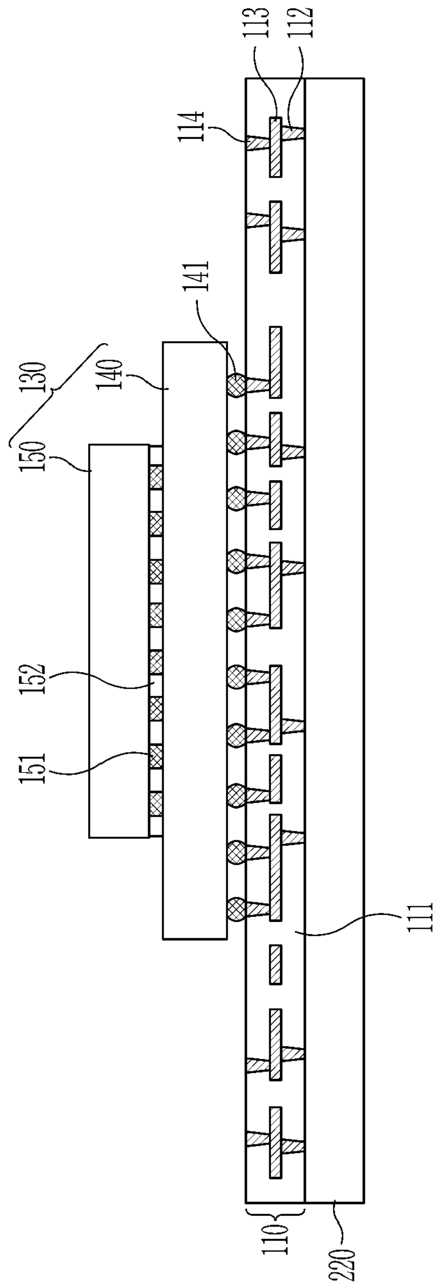

FIG. 15 is a cross-sectional view showing mounting a second semiconductor die 150 on a first semiconductor die 140 as one among steps of a method of manufacturing a semiconductor package 100.

Referring to FIG. 15, the second semiconductor die 150 is mounted on the first semiconductor die 140. The second semiconductor die 150 is bonded to the first semiconductor die 140 by connection members 151. In an embodiment, the connection member 151 may include micro bumps.

An insulating member 152 is disposed between the first semiconductor die 140 and the second semiconductor die 150 to surround the connection members 151. Stress that may occur between the first semiconductor die 140 and the second semiconductor die 150 may be alleviated by disposing the insulating member 152 between the first semiconductor die 140 and the second semiconductor die 150. In an embodiment, the insulating member 152 may include a non-conductive film (NCF). In an embodiment, the insulating member 152 may include Molded Under-Fill (MUF). In the embodiments such as in FIGS. 6, 10, and 12, a single die 153 may be used rather than two dies 140 and 150.

Figure 16:
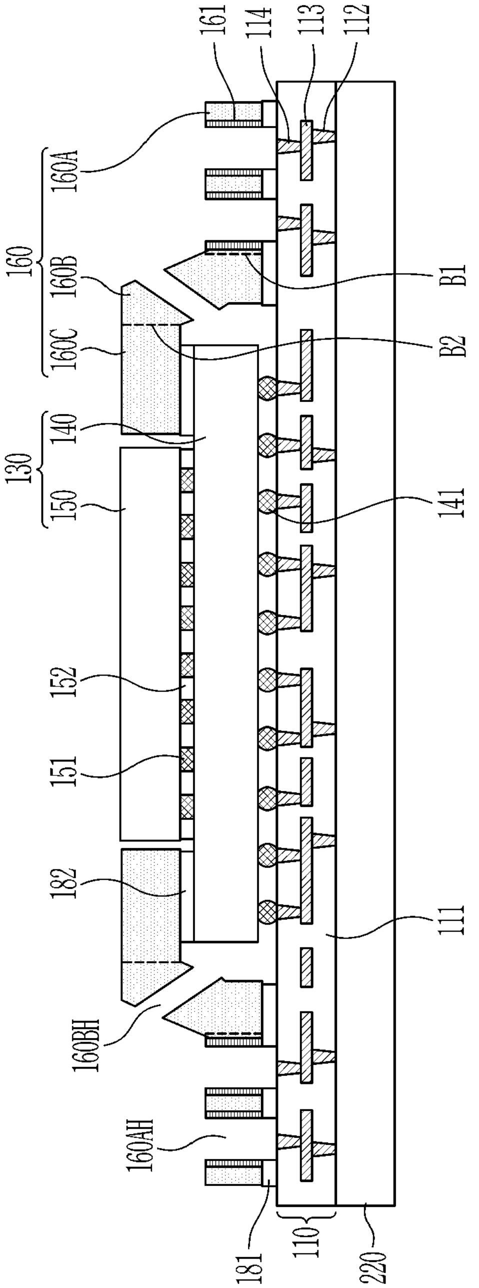

FIG. 16 is a cross-sectional view showing attaching a heat slug 160 on a front side redistribution layer structure 110 and a first semiconductor die 140 as one among steps of a method of manufacturing a semiconductor package 100.

Referring to FIG. 16, the heat slug 160 is attached on the front side redistribution layer structure 110 and the first semiconductor die 140. The supporting part 160A and the sidewall part 160B of the heat slug 160 are attached on the front side redistribution layer structure 110 by an adhesive member 181. In an embodiment, the adhesive member 181 may include or be adhesive tape, silver paste, epoxy resin, or polyimide. The upper plate part 160C of the heat slug 160 is attached on the upper surface of the first semiconductor die 140 by a thermal interface material (TIM) 182. In an embodiment, the thermal interface material (TIM) 182 may include or be a thermal paste, a thermal pad, a phase change material (PCM), or a metal material. In an embodiment, the thermal interface material (TIM) 182 may include or be grease.

According to FIG. 16, the insulating members 161 are pre-formed on the first through holes 160AH of the heat slug 160 before the conductive post 170 is disposed within the first through holes 160AH of the heat slug 160, but in another embodiment, after the conductive post 170 is disposed in the first through holes 160AH of the heat slug 160, the insulating members 161 may be formed in the first through holes 160AH of the heat slug 160. In forming the heat slug 160, in some embodiments, a single heat spreader is formed as a unitary, integrated piece, which may initially have no holes or openings. Subsequently, the openings 160CO (see FIG. 3), as well as the first and second (or third) through holes 160AH, 160BH (and 160CH) may be formed, and then the heat spreader may be placed on the front side redistribution layer structure 110 and first semiconductor die 140 (or fourth semiconductor die 153). The insulating members 161 may be formed after the first through holes 160AH are formed and before the heat spreader is place on the front side redistribution layer structure 110 and first semiconductor die 140 (or fourth semiconductor die 153), or may be formed after the heat spreader is place on the front side redistribution layer structure 110 and first semiconductor die 140 (or fourth semiconductor die 153).

Figure 17:
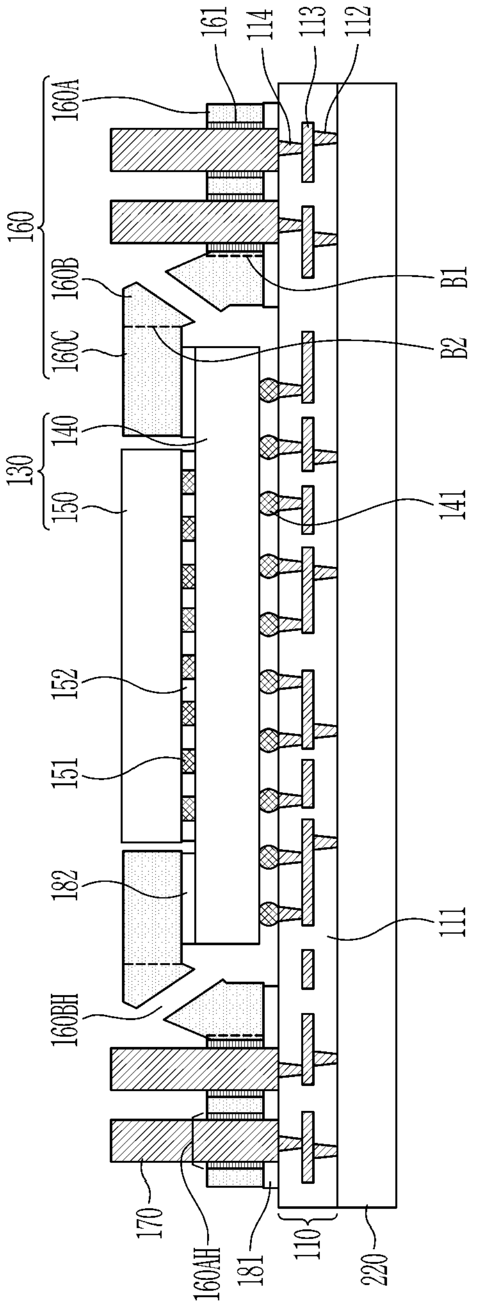

FIG. 17 is a cross-sectional view showing forming conductive posts 170 in first through holes 160AH of a heat slug 160 as one among steps of a method of manufacturing a semiconductor package 100.

Referring to FIG. 17, conductive posts 170 are formed in the first through holes 160AH of the heat slug 160.

Referring to FIG. 17, the conductive posts 170 are bonded on the front side redistribution layer structure 110 to be formed in a vertical direction. The conductive posts 170 are disposed in the first through holes 160AH to be separated from the supporting part 160A of the heat slug 160 by the insulating member 161. In an embodiment, the conductive posts 170 may be formed by performing a sputtering process. In another embodiment, the conductive posts 170 may be formed by performing an electroplating process after forming a seed metal layer. In an embodiment, the conductive posts 170 may include or be formed of at least one of copper, aluminum, tungsten, nickel, gold, silver, chromium, antimony, tin, titanium, and alloys thereof.

Figure 18:
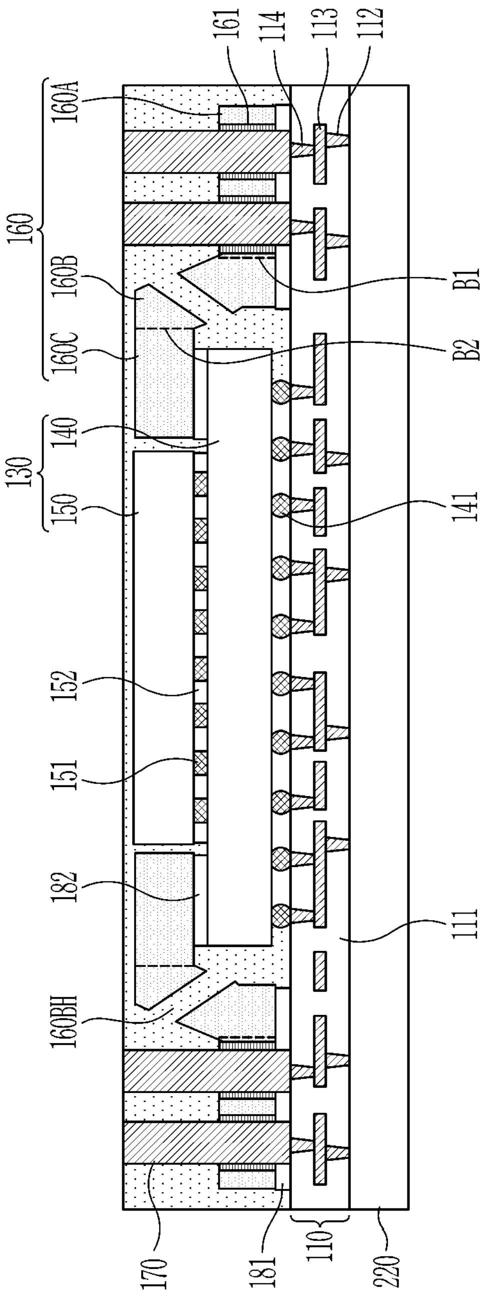

FIG. 18 is a cross-sectional view showing molding a first semiconductor die 140, a second semiconductor die 150, a heat slug 160, and conductive posts 170 on a front side redistribution layer structure 110 as one among steps of a method of manufacturing a semiconductor package 100.

Referring to FIG. 18, the first semiconductor die 140, the second semiconductor die 150, the heat slug 160, and the conductive posts 170 are molded on the front side redistribution layer structure 110 by the molding material 180. The molding material 180 moves to the inside of the heat slug 160 through the second through holes 160BH and molds (e.g., encapsulates) the first semiconductor die 140. In some embodiments, the molding process with the molding material 180 may include a compression molding or transfer molding process. In an embodiment, the molding material 180 may be formed of a thermosetting resin such as epoxy resin. In another embodiment, the molding material 180 may include or may be an epoxy molding compound (EMC).

After the molding process, a chemical mechanical polishing (CMP) is performed to level the upper surface of the molding material 180 to planarize the upper surface of the molding material 180.

Figure 19:
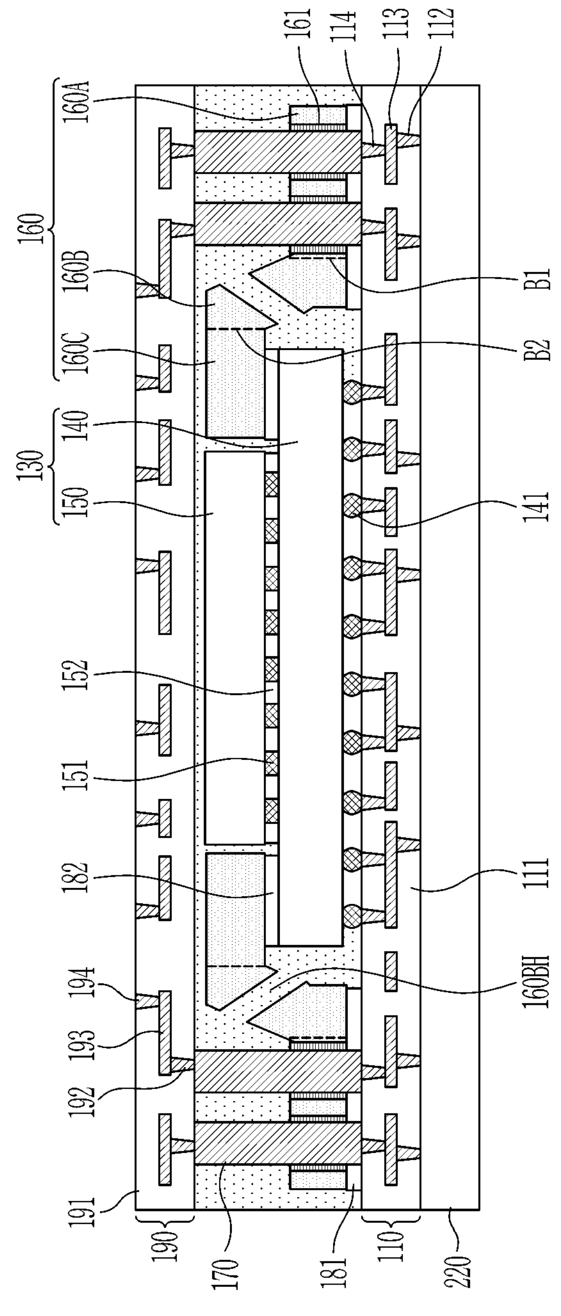

FIG. 19 is a cross-sectional view showing forming a back side redistribution layer structure 190 on a molding material 180 as one among steps of a method of manufacturing a semiconductor package 100.

Referring to FIG. 19, the back side redistribution layer structure 190 is formed on the molding material 180.

First, a second dielectric layer 191 is formed on the molding material 180. In an embodiment, the second dielectric layer 191 may include or be a photosensitive polymer layer. A photosensitive polymer is a material that can form fine patterns by applying a photolithography process. In an embodiment, the second dielectric layer 191 may include or be a photoimageable insulator (photoimageable dielectric, PID) used in the redistribution process. As an embodiment, the photoimageable dielectric (PID) may include or be a polyimide-based photosensitive polymer, a novolak-based photosensitive polymer, polybenzoxazole, a silicon-based polymer, an acrylate-based polymer, or an epoxy-based polymer. In another embodiment, the second dielectric layer 191 is formed of an inorganic dielectric material such as a silicon nitride, a silicon oxide, or the like. In an embodiment, the second dielectric layer 191 may be formed by a CVD, ALD, or PECVD process.

After forming the second dielectric layer 191, via holes are formed by selectively etching the second dielectric layer 191, and third redistribution vias 192 are formed by filling the via holes with a conducting material.

Then, the second dielectric layer 191 is additionally deposited on the third redistribution vias 192 and the second dielectric layer 191, the additionally deposited second dielectric layer 191 is selectively etched to form openings, and the openings are filled with a conducting material to form second redistribution lines 193.

Then, a second dielectric layer 191 is additionally deposited on the second redistribution lines 193 and the second dielectric layer 191, the additionally deposited second dielectric layer 191 is selectively etched to form via holes, and the via holes are filled with a conducting material to form fourth redistribution vias 194.

In an embodiment, the third redistribution vias 192, the second redistribution lines 193, and the fourth redistribution vias 194 may include or be formed of at least one of copper, aluminum, tungsten, nickel, gold, tin, titanium, and their alloys. In an embodiment, the third redistribution vias 192, the second redistribution lines 193, and the fourth redistribution vias 194 may be formed by performing a sputtering process. In another embodiment, the third redistribution vias 192, the second redistribution lines 193, and the fourth redistribution vias 194 may be formed by performing an electroplating process after forming a seed metal layer.

Figure 20:
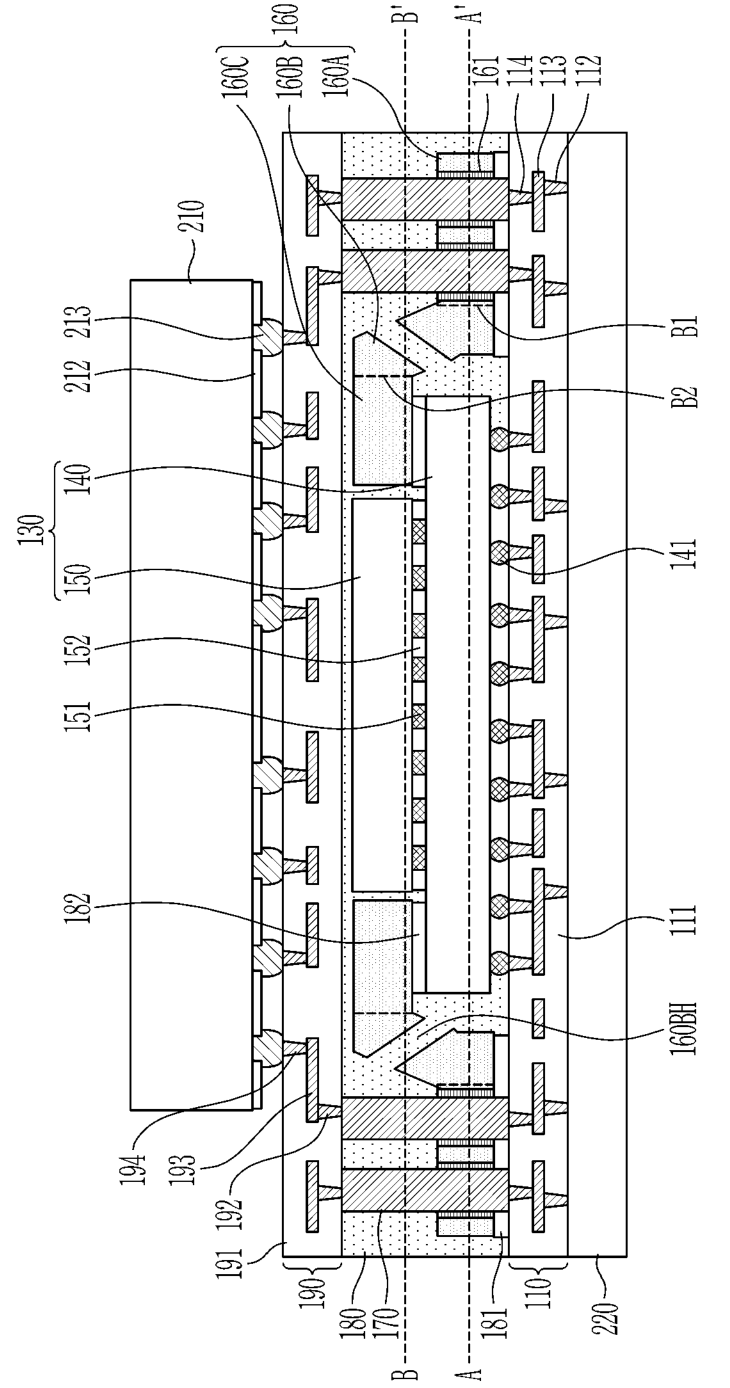

FIG. 20 is a cross-sectional view showing mounting a third semiconductor die 210 on a back side redistribution layer structure 190 as one among step of a method of manufacturing a semiconductor package 100.

Referring to FIG. 20, the third semiconductor die 210 is mounted on the back side redistribution layer structure 190. The connection members 213 of the third semiconductor die 210 are bonded to the fourth redistribution vias 194 of the back side redistribution layer structure 190, so that the third semiconductor die 210 and the back side redistribution layer structure 190 are electrically connected. In an embodiment, the connection members 213 may include or be micro bumps or solder balls.

Figure 21:
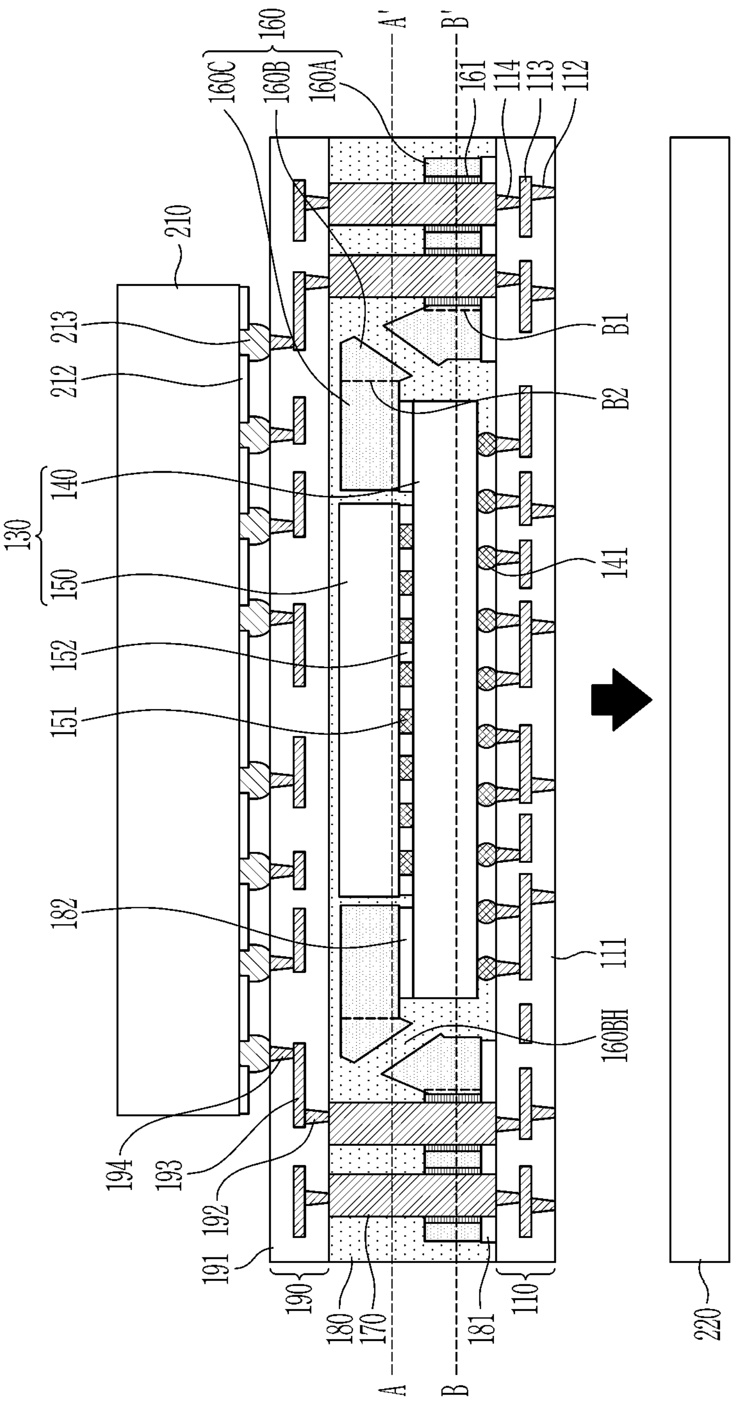

FIG. 21 is a cross-sectional view showing removing a carrier 220 from a front side redistribution layer structure 110 as one among steps of a method of manufacturing a semiconductor package 100.

Referring to FIG. 21, the carrier 220 is removed from the bottom surface of the front side redistribution layer structure 110.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

What is claimed is:

1. A semiconductor package comprising:

a substrate;

a semiconductor die on the substrate; and a heat spreader covering the semiconductor die and including an upper plate portion, a base portion, and a sidewall portion connecting the upper plate portion to the base portion, wherein the upper plate portion and the sidewall portion define an underlying cavity, wherein the base portion is disposed on the substrate, extends from an exterior side of the sidewall portion in a horizontal direction, includes a plurality of first through holes, has a bottom surface at the same level as a bottom surface of the sidewall portion, and has a height in a vertical direction from a lowermost portion to an uppermost portion thereof less than that of the sidewall portion, and has a top surface at a lower height than a top surface of the upper plate portion.

2. The semiconductor package of claim 1, wherein:

the heat spreader further includes an insulating layer conformally disposed on an inner surface of each first through hole of the plurality of first through holes.

3. The semiconductor package of claim 1, wherein:

the upper plate portion includes a through opening.

4. The semiconductor package of claim 3, wherein:

a width of the through opening in a first direction perpendicular to the vertical direction is smaller than a width of the cavity in the first direction.

5. The semiconductor package of claim 1, wherein:

the sidewall portion has a slope that inclines in an inward direction from a lower part of the sidewall portion to an upper part of the sidewall portion.

6. The semiconductor package of claim 1, wherein:

the heat spreader includes a plurality of second through holes through the upper plate portion or the sidewall portion.

7. The semiconductor package of claim 1, wherein:

the heat spreader includes an electrically conductive material.

8. The semiconductor package of claim 1, wherein:

each first through hole among the plurality of first through holes has a cross-section shape of a circle, an ellipse, or a polygon in the horizontal direction.

9. The semiconductor package of claim 1, wherein:

each first through hole among the plurality of first through holes has a width of 55 μm to 315 μm.

10. A semiconductor package comprising:

a first redistribution layer structure that forms a package substrate;

a first semiconductor die on the first redistribution layer structure;

a heat spreader including an upper plate part, a sidewall part, and a supporting part, wherein the upper plate part and the sidewall part define an underlying cavity, wherein the upper plate part covers at least part of the first semiconductor die, and wherein the supporting part is disposed on the first redistribution layer structure, extends from an exterior side of the sidewall part in a horizontal direction, includes a plurality of first through holes, has a bottom surface at the same level as a bottom surface of the sidewall part, and has a height of less than or equal to that of the sidewall part;

a plurality of conductive posts on the first redistribution layer structure; wherein each conductive post among the plurality of conductive posts passes through a respective first through hole among the plurality of first through holes;

a molding material molding the first semiconductor die, the heat spreader, and the plurality of conductive posts, and disposed on the first redistribution layer structure;

a second redistribution layer structure on the molding material and the plurality of conductive posts; and a second semiconductor die on the second redistribution layer structure.

11. The semiconductor package of claim 10, further comprising:

at least one passive element, and wherein the supporting part further includes at least one through opening in which the at least one passive element is disposed.

12. The semiconductor package of claim 10, further comprising:

an insulating member conformally disposed on an inner surface of each first through hole of the plurality of first through holes, wherein for each conductive post, the conductive post is spaced from the heat spreader by a respective insulating member.

13. The semiconductor package of claim 10, wherein:

the first semiconductor die is a system on chip (SOC).

14. The semiconductor package of claim 10, wherein:

the second semiconductor die is a semiconductor memory chip.

15. A semiconductor package comprising:

a front side redistribution layer structure;

a three-dimensional integrated circuit (3D IC) structure including a first semiconductor die on the front side redistribution layer structure and a second semiconductor die on the first semiconductor die;

a heat slug including an upper plate portion, a sidewall portion, and a base portion, wherein the upper plate portion and the sidewall portion define an underlying cavity, wherein the upper plate portion is disposed on the first semiconductor die and includes a through opening in which the second semiconductor die is disposed, and wherein the base portion is disposed on the front side redistribution layer structure, extends from an exterior side of the sidewall portion in a horizontal direction, and includes a plurality of first through holes;

a plurality of conductive posts on the front side redistribution layer structure, wherein each conductive post among the plurality of conductive posts passes through a respective first through hole among the plurality of first through holes;

a molding material molding the three-dimensional integrated circuit structure, the heat slug, and the plurality of conductive posts, and disposed on the front side redistribution layer structure;

a back side redistribution layer structure on the molding material and the plurality of conductive posts; and a third semiconductor die on the back side redistribution layer structure.

16. The semiconductor package of claim 15, further comprising:

a thermal interface material (TIM) between the upper plate portion and the first semiconductor die.

17. The semiconductor package of claim 15, further comprising:

an adhesive member between the base portion and the front side redistribution layer structure.

18. The semiconductor package of claim 15, wherein:

the heat slug includes a plurality of second through holes in the upper plate portion or the sidewall portion, and the plurality of second through holes are filled with the molding material.

19. The semiconductor package of claim 15, wherein:

the first semiconductor die is a central processing unit (CPU) or a graphics processing unit (GPU).

20. The semiconductor package of claim 15, wherein:

the second semiconductor die is a communication chip or a sensor.

* * * * *